United States Patent
West

(10) Patent No.: US 11,348,883 B2
(45) Date of Patent: May 31, 2022

(54) HIGH VOLTAGE ISOLATION BARRIER WITH ELECTRIC OVERSTRESS INTEGRITY

(71) Applicant: Texas Instruments Incorporated, Dallas, TX (US)

(72) Inventor: Jeffrey A. West, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 21 days.

(21) Appl. No.: 16/833,268

(22) Filed: Mar. 27, 2020

(65) Prior Publication Data
US 2021/0305178 A1 Sep. 30, 2021

(51) Int. Cl.
| | | |
|---|---|---|
| *H01L 23/60* | (2006.01) | |
| *H01L 23/528* | (2006.01) | |
| *H01L 23/522* | (2006.01) | |
| *H01L 25/065* | (2006.01) | |
| *H01L 21/78* | (2006.01) | |

(52) U.S. Cl.
CPC .............. *H01L 23/60* (2013.01); *H01L 21/78* (2013.01); *H01L 23/528* (2013.01); *H01L 23/5223* (2013.01); *H01L 23/5226* (2013.01); *H01L 23/5227* (2013.01); *H01L 25/0655* (2013.01)

(58) Field of Classification Search
CPC ..... H01L 23/60; H01L 21/78; H01L 23/5223; H01L 23/5226; H01L 23/5227; H01L 23/528; H01L 25/0655
See application file for complete search history.

(56) References Cited

U.S. PATENT DOCUMENTS

| | | | |
|---|---|---|---|
| 6,841,455 B2 | 1/2005 | West et al. | |
| 9,299,697 B2 | 3/2016 | West et al. | |
| 9,583,558 B2 | 2/2017 | West et al. | |
| 2009/0322447 A1* | 12/2009 | Daley | H01L 23/5227 333/185 |
| 2011/0031581 A1 | 2/2011 | West | |
| 2011/0227227 A1 | 9/2011 | West | |
| 2015/0069572 A1* | 3/2015 | Khanolkar | H01L 23/645 257/531 |
| 2020/0303319 A1* | 9/2020 | Khanolkar | H01L 25/16 |

OTHER PUBLICATIONS

International Search Report in corresponding PCT Application No. PCT/US2021/024564, dated Jul. 8, 2021 (2 pages).

* cited by examiner

*Primary Examiner* — Nicholas J Tobergte
(74) *Attorney, Agent, or Firm* — Krista Y. Chan; Charles A. Brill; Frank D. Cimino

(57) ABSTRACT

An electronic device comprises a multilevel metallization structure over a semiconductor layer and including a first region, a second region, a pre-metal level on the semiconductor layer, and N metallization structure levels over the pre-metal level, N being greater than 3. The electronic device also comprises an isolation component in the first region, the isolation component including a first terminal and a second terminal in different respective metallization structure levels, as well as a conductive shield between the first region and the second region in the multilevel metallization structure, the conductive shield including interconnected metal lines and trench vias in the respective metallization structure levels that at least partially encircle the first region.

20 Claims, 26 Drawing Sheets

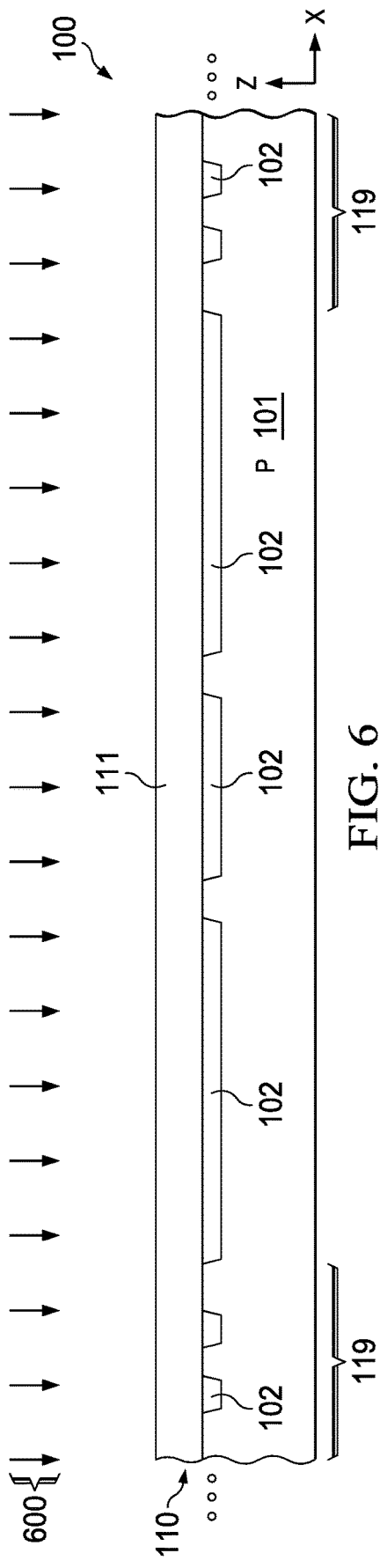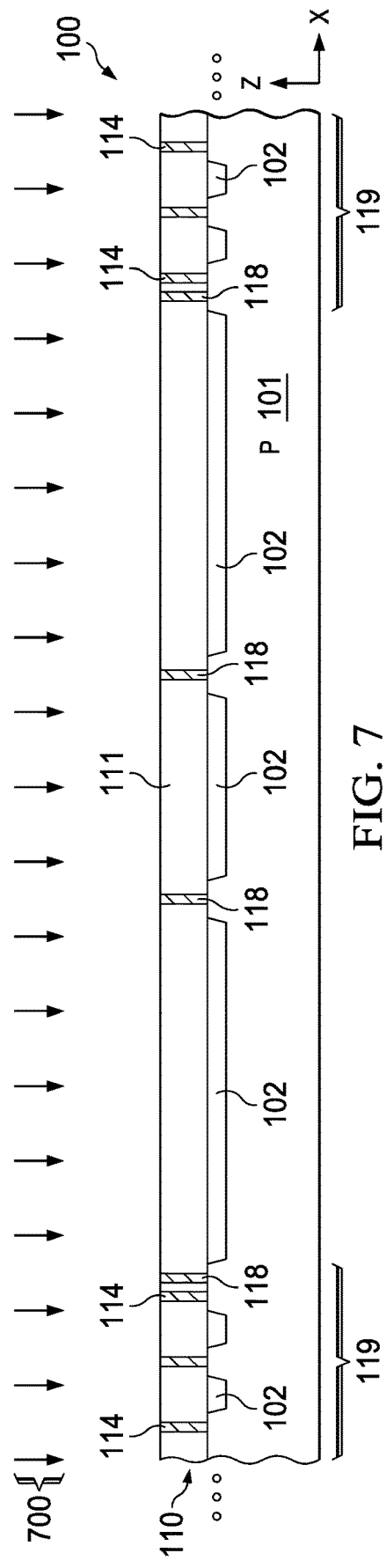

US 11,348,883 B2

HIGH VOLTAGE ISOLATION BARRIER WITH ELECTRIC OVERSTRESS INTEGRITY

BACKGROUND

Many circuits include circuitry in multiple voltage domains, such as low voltage logic circuitry in a low voltage domain, and communications driver circuits in a second, high voltage domain. In normal operation, high voltage digital isolators provide communication channels between different voltage domains while protecting low voltage circuits against device degradation from harmful currents or voltages on the high voltage domain. An electrical overstress (EOS) event in the circuitry near the high voltage isolation barrier component could potentially damage the high voltage barrier, rendering it unable to isolate the low voltage circuitry from the high voltage domain.

SUMMARY

In one aspect, an electronic device includes a multilevel metallization structure over a semiconductor layer, as well as an isolation component in a first region, and a conductive shield between the first region and a second region of the metallization structure. The metallization structure includes a pre-metal level on the semiconductor layer and metallization structure levels over the pre-metal level. The isolation component includes first and second terminals in different metallization structure levels. The conductive shield includes interconnected metal lines and trench vias that encircle the first region in the respective metallization structure levels. In one example, the isolation component is a capacitor. In another example, the isolation component is a transformer. In one example, the second terminal of the isolation component is in a top or final metallization structure level and includes an exposed side. In one example, the first region includes multiple isolation components. In one example, one of the metallization structure levels includes a metal line with a gap, as well as a metal routing feature that extends through and is connected to the first terminal of the isolation component. The conductive shield in one example has staircase shape in a side elevation view.

A packaged electronic device is provided in another aspect of the disclosure. The packaged electronic device includes first and second semiconductor dies within the device. The dies and the electrical connections are enclosed in a package structure with partially exposed leads. The first semiconductor die includes a semiconductor layer, a multilevel metallization structure with first and second regions over the semiconductor layer, an isolation component in a first region of the metallization structure, and a conductive shield with interconnected metal lines and trench vias between the first and second regions. In one example, the conductive shield has staircase shape. In one example, the isolation component is a capacitor. In another example, the isolation component is a transformer. In one example, the second die also includes a second semiconductor layer, a second multilevel metallization structure with first and second regions over the second semiconductor layer, a second isolation component in a first region of the second metallization structure.

Another aspect provides a method that includes forming a multilevel metallization structure over a semiconductor layer, with first and second regions and a conductive shield with interconnected metal lines and trench vias between the first and second regions. The method also includes separating a first semiconductor die including the semiconductor layer and the multilevel metallization structure from a wafer, forming an electrical connection between the second terminal of the isolation component and a conductive feature of a second semiconductor die, and enclosing the first semiconductor die, the second semiconductor die, and the electrical connection in a package structure with conductive leads exposed along one or more sides of the package structure.

BRIEF DESCRIPTION OF THE DRAWINGS

FIGS. 6-25 are partial sectional side elevation views of the device of FIGS. 1-3 undergoing metallization structure fabrication processing according to the method of FIG. 5.

DETAILED DESCRIPTION

Figure 1:
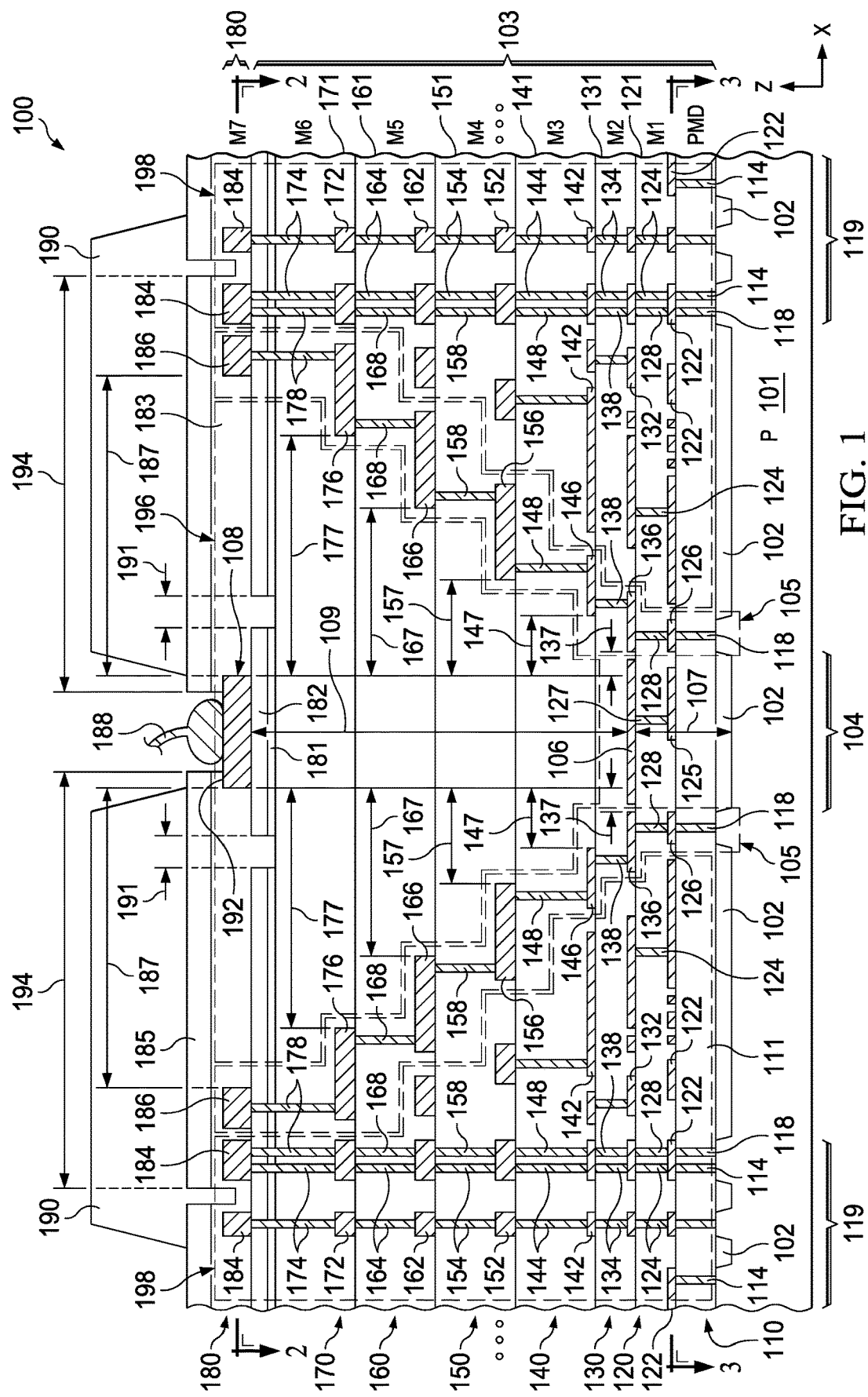
FIG. 1 is a partial sectional side elevation view of an electronic device with an isolation capacitor in a first region encircled by a conductive shield in a multilevel metallization structure above a semiconductor layer.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 2:
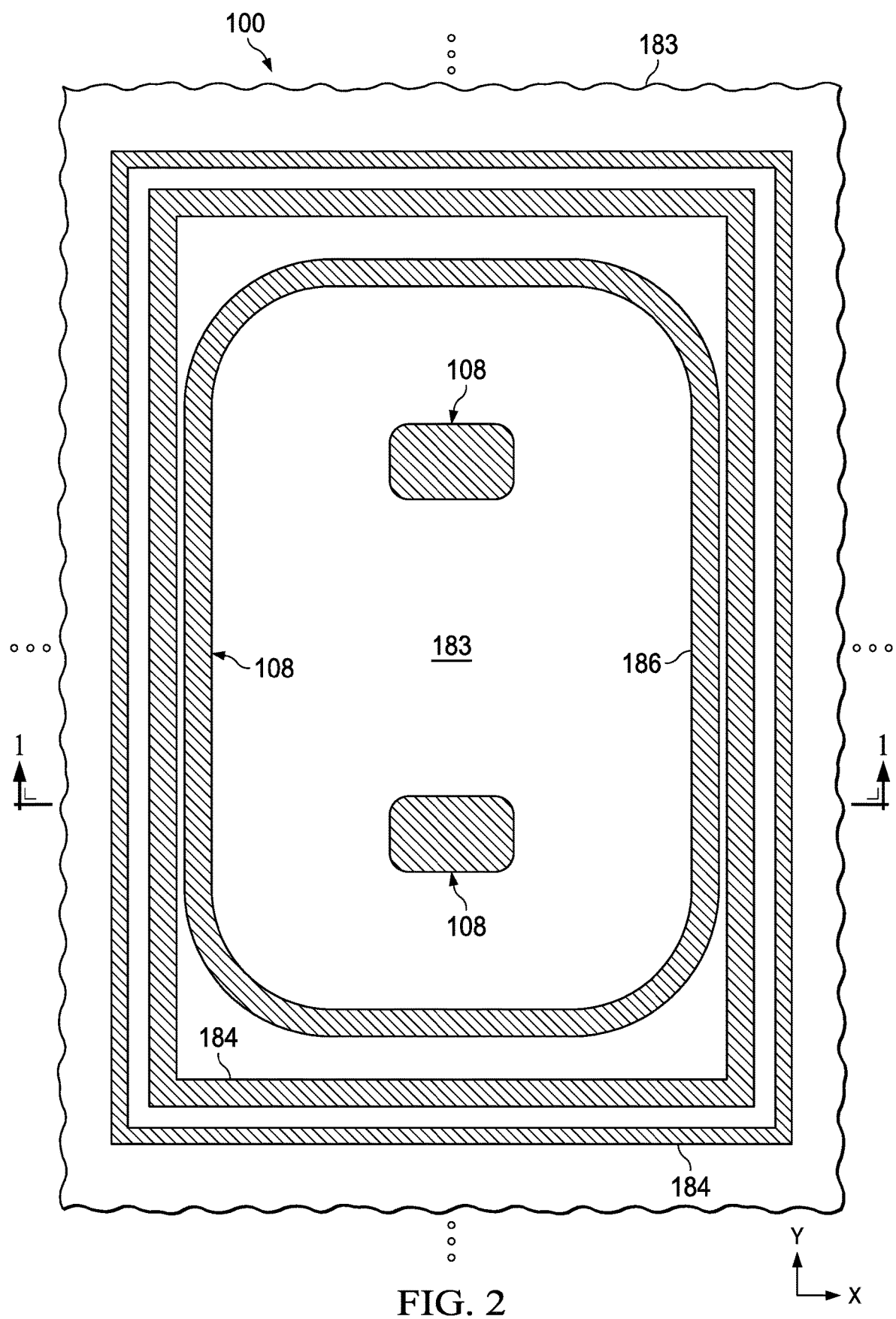
FIG. 2 is a partial sectional top plan view taken along line 2-2 in the electronic device of FIG. 1.
Figure 3:
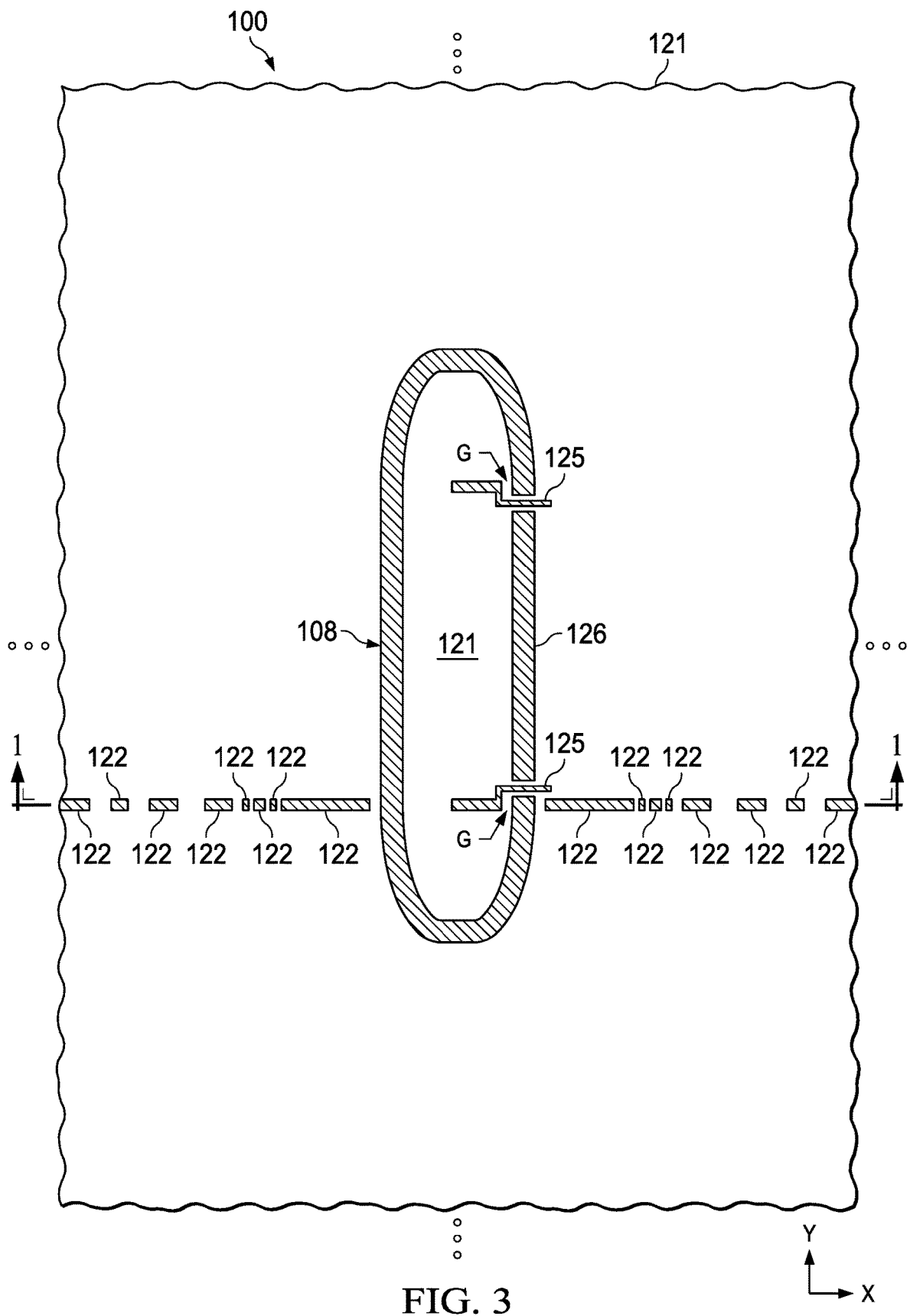
FIG. 3 is a partial sectional top plan view taken along line 3-3 in the electronic device of FIG. 1.

Referring initially to FIGS. 1-3, FIG. 1 shows a partial sectional side view of an electronic device 100, and FIGS. 2 and 3 show respective top section views of portions of the electronic device 100 taken along lines 2-2 and 3-3 in FIG. 1. The electronic device 100 includes a semiconductor layer 101. In one example, the semiconductor layer 101 is or includes a p-type semiconductor material having isolation structures 102 (e.g., shallow trench isolation or STI structures) formed on or in a top side of the semiconductor layer 101. The semiconductor layer 101 in one example is a silicon layer, a silicon-germanium layer, a silicon-on-insulator (SOI) structure, or another layer having semiconductor material. The electronic device 100 further includes a multilevel metallization structure 103 disposed over a top side of the semiconductor layer 101. In addition, the electronic device 100 includes an isolation component 104 and a conductive shield 105 in the multilevel metallization structure 103.

As discussed further below, the isolation component 104 is in a first region of the multilevel metallization structure 103, and the conductive shield 105 is formed by interconnected metal lines and trench vias of the multilevel metallization structure to provide a Faraday cage around the isolation component 104. The conductive shield 105 separates the first region from an outer second region of the multilevel metallization structure 103. In one implementation, the electronic device 100 also includes further circuitry (e.g., low voltage logic circuits, not shown) formed on and/or in the semiconductor layer 101 beneath the outer second region of the multilevel metallization structure 103.

In the example of FIG. 1, the isolation component 104 is a capacitor that includes a first (e.g., lower or bottom) terminal 106 (e.g., a first capacitor plate) that is spaced from the semiconductor layer 101 by a distance 107 (e.g., 2.8 µm). As discussed further below, the conductive shield 105 in one example includes a gap in one of the constituent metal layers, and a conductive routing feature connects low voltage logic circuitry of the second region to the first terminal 106 of the isolation component 104. The capacitor 104 also includes a second (e.g., upper or top) terminal 108 (e.g., a second capacitor plate). In this example, the first and second terminals 106 and 108 are generally parallel to one another, although not a strict requirement of all possible implementations. In addition, the first and second terminals 106 and 108 are separated from one another by a distance 109 (e.g., 12.7 µm), with dielectric material layers between the terminals 106 and 108 to form a capacitor 104. In the illustrated example, the second terminal 108 of the capacitor isolation component 104 includes an exposed top side, allowing the second terminal 108 to be (e.g., a bond wire) a high voltage domain terminal of a second semiconductor die (e.g., FIGS. 4 and 26 below).

The multilevel metallization structure 103 includes a pre-metal level 110 and an integer number N metallization structure levels, where N is greater than 3. The example of FIGS. 1-3 includes N=7 metallization structure levels. The pre-metal level 110 includes a pre-metal dielectric (PMD) layer 111 on the semiconductor layer 101. In one example, the PMD layer 111 is or includes silicon dioxide ($SiO_2$) with a thickness of about 1.2 µm. The pre-metal level 110 includes cylindrical contacts 114 and a pre-metal trench contact 118 on the semiconductor layer 101. The contacts 114 and 118 extend through the PMD layer 111 along the vertical (e.g., Z) direction in FIG. 1. The trench contact 118 encircles a central first portion of the PMD layer 111 in the pre-metal level 110 with no gap. In one example, the pre-metal level contacts 114 and the trench contacts 118 are or include tungsten. In the illustrated example, the pre-metal trench contact 118 is connected to the semiconductor layer 101 to form a ground connection between STI sections 102 as shown in FIG. 1 to provide a lower section of the conductive shield 105 that operates as a grounded Faraday cage around the isolation component 104. The pre-metal level 110 also includes trench contacts 118 in regions 119 near the outer periphery of the illustrated portion of the electronic device 100, for example, to provide protection against cracks and mechanical stress on the device 100, although not a strict requirement of all possible implementations.

As shown in FIGS. 1 and 3, the multilevel metallization structure 103 also includes a first metallization structure level 120 (e.g., labelled M1 in FIG. 1) on the pre-metal level 110. The first metallization structure level 120 includes a first interlevel dielectric (ILD) layer 121, as well as conductive metal lines 122 and cylindrical tungsten vias 124 in the second portion of the multilevel metallization structure 103. The first metallization structure level 120 also includes a metal routing feature 125, a first metal line 126, a routing via 127 on the metal routing feature 125 in the first portion of the multilevel metallization structure 103. The first metal line 126 in one example is or includes aluminum metal with a thickness along the Z direction in FIG. 1 of approximately 0.61 µm. In addition, the first metallization structure level 120 includes a first trench via 128 on the first metal line 126. The first ILD layer 121 extends on the PMD layer 111, the metal routing feature 125 and the first metal line 126. The first metal line 126 extends at least partially on the pre-metal trench contact 118, and the first trench via 128 extends on the first metal line 126. The first trench via 128 and the first metal line 126 encircle another portion of the first region of the multilevel metallization structure 103 in the first metallization structure level 120. The first ILD layer 121 in one example is or includes silicon dioxide ($SiO_2$) with a thickness (e.g., along the Z direction in FIG. 1) of approximately 1.2 µm.

As shown in FIG. 3, the metal routing feature 125 extends from the first region, through a gap G in the first metal line 126, to the second region of the first metallization structure level 120. The first metallization structure level 120 also includes trench vias 128 in the region 119 near the outer periphery of the illustrated portion of the electronic device 100, for example, to provide reduction against cracks and mechanical stress on the device 100, although not a strict requirement of all possible implementations. The first metallization structure level 120, and the other metallization structure levels in the example of FIGS. 1-3 includes vias 114 and trench contacts 118 that are or include tungsten, although not a requirement of all possible implementations. In addition, the first metallization structure level 120 and the other metallization structure levels of the multilevel metallization structure 103 include metal lines that are or include aluminum or copper, although not a requirement of all possible implementations.

A second metallization structure level 130 (labeled M2 in FIG. 1) extends on the first metallization structure level 120 in the multilevel metallization structure 103. The second metallization structure level 130 includes a second ILD layer 131, as well as conductive metal lines 132 and cylindrical tungsten vias 134 in the second portion of the multilevel metallization structure 103. The second ILD layer 131 in one example is or includes silicon dioxide with a thickness along the Z of approximately 1.2 µm. The second metallization structure level 130 further includes a second metal line 136 at least partially on the first trench via 128, and a second trench via 138 on the second metal line 136. The second metal line 136 in one example is or includes aluminum metal with a thickness along the Z direction in FIG. 1 of approximately 0.61 µm. The second metallization structure level 130 also includes the first terminal 106 of the isolation component 104 spaced from the second metal line 136 and extending at least partially over the routing via 127 on the metal routing feature 125 in a central first portion of the second metallization structure level 130. The second ILD layer 131 in this example extends on the first ILD layer 121, the second metal line 136, and the first terminal 106. A second trench via 138 extends on the second metal line 136. The second trench via 138 and the second metal line 136 encircle a second portion of the first region of the second metallization structure level 130. As shown in FIG. 1, the second terminal 108 of the isolation component 104 includes lateral edges (left and right sides in FIG. 1), and the respective first and second metal lines 126 and 136 include opposite lateral edges spaced from the respective lateral edges of the second terminal 108 along a first direction (e.g., the X direction in FIGS. 1-3) by respective a non-zero spacing distance 137. The second metallization structure level 130 also includes trench vias 138 in the region 119 near the outer periphery of the illustrated portion of the electronic device 100, although not a strict requirement of all possible implementations.

The multilevel metallization structure 103 also includes a third metallization structure level 140 (labeled M3 in FIG. 1). The third metallization structure level 140 extends on the second metallization structure level 130 in the multilevel metallization structure 103. The third metallization structure level 140 includes a third ILD layer 141, as well as conductive metal lines 142 and cylindrical tungsten vias 144 in the second portion of the multilevel metallization structure 103. The third ILD layer 141 in one example is or includes silicon dioxide with a thickness along the Z of approximately 2.5 µm. The third metallization structure level 140 further includes a third metal line 146 at least partially on the second trench via 138, and a third trench via 148 on the third metal line 146. The third metal line 146 in one example is or includes aluminum metal with a thickness along the Z direction in FIG. 1 of approximately 0.61 µm. The third ILD layer 141 in this example extends on the second ILD layer 131 and the third metal line 146. A third trench via 148 extends through the third ILD layer 141 on the third metal line 146. The third trench via 148 and the third metal line 146 encircle a portion of the first region of the third metallization structure level 140. As shown in FIG. 1, the third metal line 146 includes lateral edges spaced from the respective lateral edges of the second terminal 108 along the X direction by a non-zero spacing distance 147. The conductive shield 105 in FIGS. 1-3 includes a staircase shape shown in FIG. 1, in which the non-zero spacing distance 147 (e.g., approximately 30 µm) is greater than the spacing distance 137 of the preceding (e.g., underlying) second metallization structure level 130. The third metallization structure level 140 also includes a trench via 148 in the region 119 near the outer periphery of the illustrated portion of the electronic device 100, although not a strict requirement of all possible implementations.

A fourth metallization structure level 150 (labeled M4 in FIG. 1) extends on the third metallization structure level 140 in the multilevel metallization structure 103. The fourth metallization structure level 150 includes a fourth ILD layer 151, as well as conductive metal lines 152 and cylindrical tungsten vias 154 in the second portion of the multilevel metallization structure 103. The fourth ILD layer 151 in one example is or includes silicon dioxide with a thickness along the Z of approximately 3.2 µm. The fourth metallization structure level 150 further includes a fourth metal line 156 at least partially on the third trench via 148, and a fourth trench via 158 on the fourth metal line 156. The fourth metal line 146 in one example is or includes aluminum metal with a thickness along the Z direction in FIG. 1 of approximately 1.3 µm. The fourth ILD layer 151 in this example extends on the third ILD layer 141 and the fourth metal line 156. A fourth trench via 158 extends through the fourth ILD layer 151 on the fourth metal line 156. The fourth trench via 158 and the fourth metal line 156 encircle a portion of the first region of the fourth metallization structure level 150. As shown in FIG. 1, the fourth metal line 156 includes lateral edges spaced from the respective lateral edges of the second terminal 108 along the X direction by a non-zero spacing distance 157 (e.g., approximately 40 µm) that is greater than the spacing distance 147 of the preceding (e.g., underlying) third metallization structure level 140. The fourth metallization structure level 150 also includes trench vias 158 in the region 119 near the outer periphery of the illustrated portion of the electronic device 100, although not a strict requirement of all possible implementations.

The multilevel metallization structure 103 also includes a fifth metallization structure level 160 (labeled M5 in FIG. 1) that extends on the fourth metallization structure level 150 in the multilevel metallization structure 103. The fifth metallization structure level 160 includes a fifth ILD layer 161, as well as conductive metal lines 162 and cylindrical tungsten vias 164 in the second portion of the multilevel metallization structure 103. The fifth ILD layer 161 in one example is or includes silicon dioxide with a thickness along the Z of approximately 3.2 µm. The fifth metallization structure level 160 further includes a fifth metal line 166 at least partially on the fourth trench via 158, and a fifth trench via 168 on the fifth metal line 166. The fifth metal line 166 in one example is or includes aluminum metal with a thickness along the Z direction in FIG. 1 of approximately 1.3 µm. The fifth ILD layer 161 in this example extends on the fourth ILD layer 151 and the fifth metal line 166. A fifth trench via 168 extends through the fifth ILD layer 161 on the fifth metal line 166. The fifth trench via 168 and the fifth metal line 166 encircle a portion of the first region of the fifth metallization structure level 160. As shown in FIG. 1, the fifth metal line 166 includes lateral edges spaced from the respective lateral edges of the second terminal 108 along the X direction by a non-zero spacing distance 167 (e.g., approximately 50 µm) that is greater than the spacing distance 157 of the preceding (e.g., underlying) fourth metallization structure level 150. The fifth metallization structure level 160 also includes trench vias 168 in the region 119 near the outer periphery of the illustrated portion of the electronic device 100, although not a strict requirement of all possible implementations.

A sixth metallization structure level 170 (labeled M6 in FIG. 1) extends on the fifth metallization structure level 160 in the multilevel metallization structure 103. The sixth metallization structure level 170 includes a sixth ILD layer 171, as well as conductive metal lines 172 and cylindrical tungsten vias 174 in the second portion of the multilevel metallization structure 103. The sixth ILD layer 171 in one example is or includes silicon dioxide with a thickness along the Z of approximately 3.2 µm. The sixth metallization structure level 170 further includes a sixth metal line 176 at least partially on the fifth trench via 168, and a sixth trench via 178 on the sixth metal line 176. The sixth metal line 176 in one example is or includes aluminum metal with a thickness along the Z direction in FIG. 1 of approximately 1.3 µm. The sixth ILD layer 171 in this example extends on the fifth ILD layer 161 and the sixth metal line 176. A sixth trench via 178 extends through the sixth ILD layer 171 on the sixth metal line 176. The sixth trench via 178 and the sixth metal line 176 encircle a portion of the first region of the sixth metallization structure level 170. As shown in FIG. 1, the sixth metal line 176 includes lateral edges spaced from the respective lateral edges of the second terminal 108 along the X direction by a non-zero spacing distance 177 (e.g., approximately 70 µm) that is greater than the spacing distance 167 of the preceding (e.g., underlying) fifth metallization structure level 160. The sixth metallization structure level 170 also includes trench vias 178 in the region 119 near the outer periphery of the illustrated portion of the electronic device 100, although not a strict requirement of all possible implementations.

The example multilevel metallization structure 103 in FIGS. 1-3 has N metallization structure levels, where N=7. The uppermost or top (e.g., $N^{th}$ or seventh) metallization structure level 180 (labeled M7 in FIG. 1) extends on the sixth metallization structure level 170 in the multilevel metallization structure 103. The seventh metallization structure level 180 includes a bilayer structure with a 0.3 µm thick layer 181 that is or includes silicon oxynitride (SiON), and a 0.55 µm layer 182 that is or includes silicon nitride (SiN). The seventh metallization structure level 180 also includes a protective overcoat (PO) layer 183 (e.g., $SiO_2$), conductive metal lines 184 in the second portion of the multilevel metallization structure 103, some of which lead to conductive die pads that provide electrical conductivity to external components (e.g., another die or a conductive feature of a lead frame, not shown). A silicon oxynitride layer 185 extends on portions of the layer 183 and has a thickness in one example of 2.8 µm. Together, the layers 183 and 184 form a protective overcoat (PO) layer.

In addition, the seventh (e.g., $N^{th}$) metallization structure level 180 includes the second terminal 108 of the isolation component 104 and a seventh (e.g., $N^{th}$) metal line 186. The second terminal 108 is spaced from the $N^{th}$ metal line 186 as shown in FIGS. 1 and 2 by a non-zero spacing distance 187 (e.g., approximately 90 µm) that is greater than the spacing distance 177 of the preceding (e.g., underlying) sixth metallization structure level 170. The layer 183 in one example is or includes silicon dioxide with a thickness along the Z of approximately 4.5 µm. The seventh metal line 186 extends at least partially on the sixth trench via 178. The seventh metal line 186 in one example is or includes aluminum metal with a thickness along the Z direction in FIG. 1 of approximately 3.0 µm. The layer 183 in this example extends on bilayer structure 181, 182 and on the sixth ILD layer 171 in a gap of the bilayer 181, 182. In addition, the layer 183 extends on a portion of the second terminal 108 and on the seventh metal line 186. The seventh metal line 186 encircles the upper portion of the first region of the seventh metallization structure level 180 to complete the conductive shield 105.

The example electronic device 100 in FIGS. 1-3 includes the capacitor isolation component 104 with the first terminal 106 in the second metallization structure level 130, and the second terminal 108 in the seventh metallization structure level 180. In other implementations, the respective first and second terminals 106 and 108 can be in different ones of the metallization structure levels 120, 130, 140, 150, 160, 170, 180. In the illustrated example, moreover, the staircase shape of the conductive shield 105 includes gradually increasing spacing distances 137, 147, 157, 167, 177 and 187, although not a strict requirement of all possible implementations. In addition, different implementations include a conductive shield with a non-staircase shape. The illustrated staircase shape advantageously provides a generally consistent spacing between the second terminal 108 of the isolation component 104 and the shield structure 105. The conductive shield 105 provides a generally continuous conductive metal (e.g., copper, tantalum nitride, titanium, titanium nitride, aluminum, tungsten) Faraday cage or shield structure that is connected by the trench contacts 118 to the semiconductor layer 101 to provide a grounded shield that completely encircles the first region of the multilevel metallization structure 103. In one example, copper-doped aluminum lines are sandwiched by titanium nitride, and copper lines are encapsulated on three sides by tantalum nitride. Trench vias in certain implementations are or include tungsten or copper for copper damascene schemes, to form the conductive shield structure 105.

In one implementation, the second terminal 108 of the isolation component 104 is electrically connected to a high-voltage signal from a circuit (e.g., and a second semiconductor die) in a different voltage domain than circuitry of the second portion of the multilevel metallization structure 103. In one example, the electronic device 100 includes low-voltage logic circuitry (not shown) with connections and routing structures in the second portion of the multilevel metallization structure 103, and the conductive shield 105 provides a substantially continuous isolation barrier between the second portion and the first portion of the multilevel metallization structure 103. In the illustrated implementation, the conductive shield 105 is created by the interconnected metal lines 126, 136, 146, 156, 166, 176, 186 and trench contacts/vias 118, 128, 138, 148, 158, 168, 178 in the respective metallization structure levels 120, 130, 140, 150, 160, 170, 180 that encircle the first region 196 of the multilevel metallization structure 103, with only one or more small gaps G (e.g., FIG. 3) for electrical connection of the first terminal 106 to low voltage circuitry or connections of the second portion of the multilevel metallization structure 103.

The electronic device 100 in one example includes two or more isolation components 104 (e.g., capacitors with top plates or second terminals 108 seen in FIG. 2). In one implementation, a pair, or multiple pairs, of capacitor isolation components 104 are provided in the first portion of the multilevel metallization structure 103, and the conductive shield 105 provides a single grounded Faraday cage structure that surrounds all the isolation components 104. In a further alternate implementation, multiple conductive shields 105 are created in the multilevel metallization structure 103, to provide multiple grounded Faraday cage structures that individually surround one or more associated isolation components. In the example of FIGS. 1-3, the individual capacitor isolation components 104 are laterally spaced from one another in the first region of the multilevel metallization structure 103, and individually include first and second terminals 106 and 108 that are in different ones of the metallization structure levels (e.g., levels 130 and 180 in the illustrated example). In the example of FIGS. 1-3, moreover, each of the capacitor isolation components 104 includes an associated conductive routing feature 125 extending through a corresponding gap G in the metal line 126.

As shown in FIG. 1, the example upper capacitor plates or second terminal 108 can be soldered or otherwise electrically connected to another circuit (e.g., of a high voltage domain). FIG. 1 shows one example in which a bond wire 188 has a first end soldered to an exposed top side 192 of the second terminal 108 to facilitate electrical connection to a conductive feature of another die (e.g., as illustrated and described further below in connection with FIGS. 4 and 26). The example electronic device 100 also includes a 10 µm thick polyimide layer 190 that extends over portions of the protective overcoat layers 183 and 185. The polyimide layer 190 in one example provides a stress barrier to mitigate mechanical stress on the semiconductor layer 101 and the multilevel metallization structure 103 following enclosure in a molded packaging structure, for example, to mitigate mechanical stress between the overlying mold compound and the surface of 185 that could potentially delaminate after some number of temperature cycling events.

The polyimide layer 190, the protective oxide layer 185 and the layer 183 in this example include a gap that exposes the top side 192 of the second terminal 108. The layers 181 and 182 in this example include gaps with lateral gap distance 191 fully surrounding the second terminal 108. In addition, the layers 183 and 185 include a recess or gap laterally spaced along the X direction from the bond wire opening by a distance 194 (e.g., 273 µm). This recess or gap is located between the outermost conducive lines 184 in one example in order to terminate dicing-induced cracks from entering the die. The distance 194 varies in different implementations depending on what external circuitry exists around the isolation component, and the recess or gap fully surrounds the die in one example. As shown in dashed line form in FIG. 1, the conductive shield 105 provides a grounded Faraday cage with a telescoping staircase structure that surrounds the capacitor isolation component 104 and separates a first region 196 (e.g., associated with a high-voltage domain) from a second region 198 (e.g., associated with a lower or different voltage domain).

Figure 4:
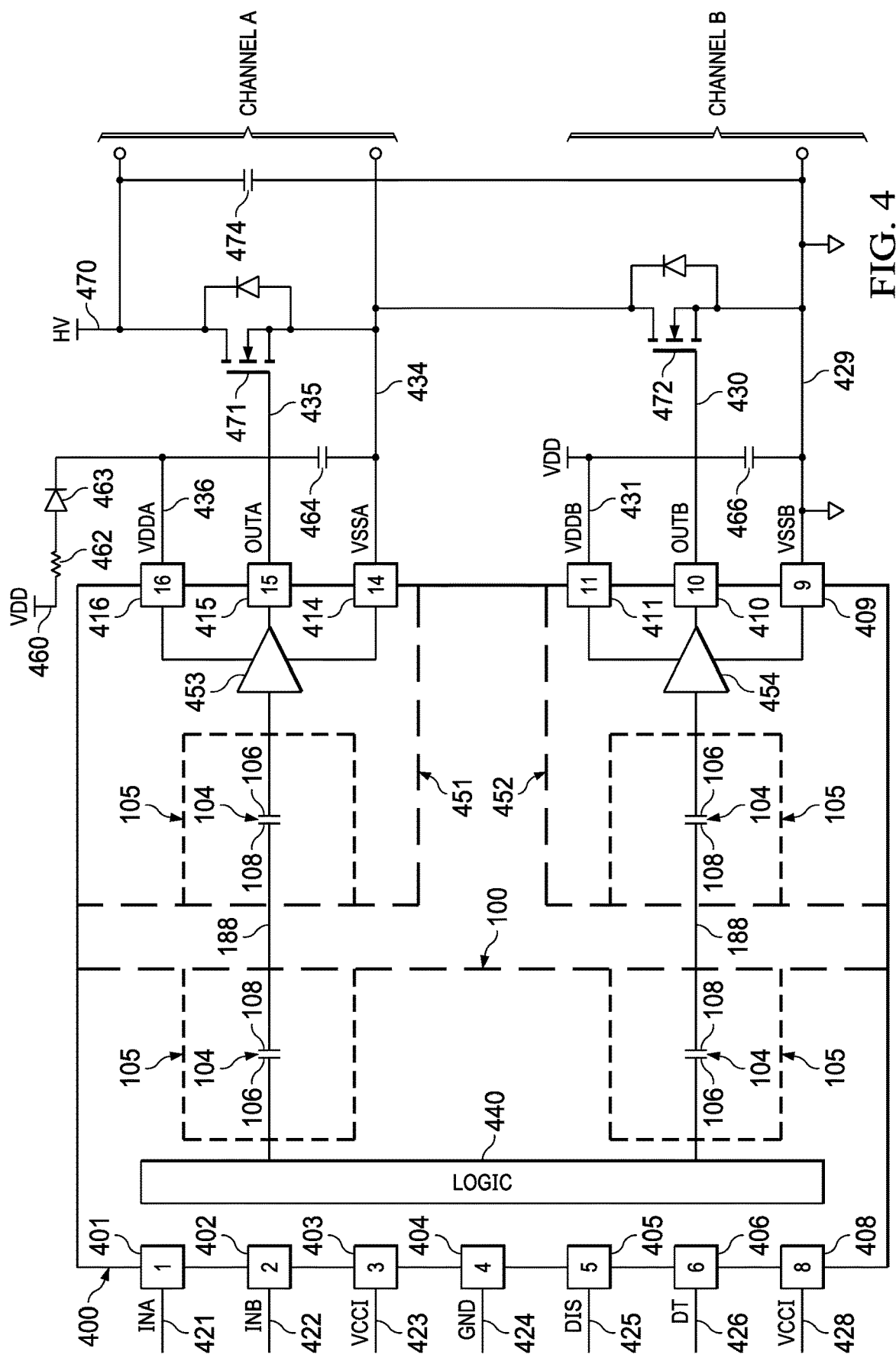
FIG. 4 is a schematic diagram of a packaged electronic device including the device of FIGS. 1-3.

FIG. 4 schematically illustrates an example packaged electronic device 400 that includes the above described electronic device 100. In this example, the packaged electronic device 400 includes a first die 100 that represents a singulated or separated semiconductor die as depicted and described above in connection with FIGS. 1-3. The device 100 of the first die has a multilevel metallization structure 103 with a conductive shield 105 between the isolated first and second regions 196 and 198 and capacitor isolation component 104 as previously described. The first semiconductor die or electronic device 100 is packaged together with one or more additional semiconductor dies to create a packaged electronic component with conductive leads or terminals 401, 402, 403, 404, 405, 406, 408 associated with a first (e.g., low-voltage) voltage domain, and conductive leads or terminals 409, 410, 411, 414, 415 and 416 associated with one or more additional (e.g., higher voltage) voltage domains.

As schematically shown in FIG. 4, the electronic device 100 (e.g., the first semiconductor die) includes a pair of capacitors 104, each having a first terminal 106 and a second terminal 108 connected (e.g., wire bonded) to a corresponding bond wire 188. In a corresponding user application (e.g., a communication system printed circuit board), the terminals 401-406, 408-411 and 414-416 are soldered to corresponding circuit board traces 421-426, 428-431 and 434-436 to provide electrical interconnection and operation with associated signal lines or signals INA, INB, VCCI, GND, DIS, DT, VCCI, VSSB, OUTB, VDDB, VSSA, OUTA and VDDA, respectively. The first die or electronic device 100 in this example includes a logic circuit 440 that provides low voltage first and second communication channel signals to the first terminals 106 of the respective capacitors 104.

The conductive shield 105 of the first semiconductor die electronic device 100 in FIGS. 1 and 4 isolates the first portion 196 of the multilevel metallization structure 103 from high voltages associated with the second terminals 108. The capacitors 104 in FIG. 4 provide an isolation barrier between the logic circuit 440 and capacitively coupled circuits of first and second additional semiconductor dies 451 and 452 of the packaged electronic device 400. In one example, the semiconductor dies 451 and 452 also include a multilevel metallization structure 103 with a conductive shield 105 between the isolated first and second regions 196 and 198 and a capacitor 104 with plate terminals 106 and 108 as previously described. As shown in FIG. 4, the respective bond wires 188 are wire bonded to the exposed top sides 192 of the second terminals 108 to provide series connected capacitor coupling between the logic circuit 440 and respective drivers 453 and 454 of the semiconductor dies 451 and 452. In another example, the second and third semiconductor dies 451 and 452 do not include internal isolation capacitors, and the bond wires 188 are soldered to a conductive feature of the respective semiconductor dies 451 and 452, for example, to inputs of the respective drivers 453 and 454 (see example in FIG. 26 below). The semiconductor dies 451 and 452 in one example are receivers of the packaged electronic device 400 with output from the respective drivers 453 and 454 connected to external circuitry that controls a voltage VSSA at a switching node 434.

A first receiver output channel (e.g., channel "A") in FIG. 4 provides a first channel driver output biased to a supply voltage VDD received at a supply node 460. The supply node 460 is connected through a boot resistor 462 and a diode 463 to provide a first supply voltage signal VDDA at the circuit board trace 436. The first driver 453 receives the first supply voltage VDDA as an upper rail supply, and a lower rail of the driver 453 is connected to the circuit board trace 434 to operate at a reference voltage VSSA. The external circuitry includes a boot capacitor 464 connected between the terminals 414 and 416, and the output of the driver 453 is connected to the terminal for 15 to provide a first gate drive output. A second receiver output channel (e.g., channel "B") includes the second driver 454 of the second semiconductor die 452, which is biased according to the supply voltage VDD and a ground reference voltage VSSB at the terminals 411 and 409, respectively. The external circuitry also includes a supply voltage capacitor 466 connected between the supply voltage VDD and the ground reference voltage VSSB at the ground reference node 429. In operation, the drivers 453 and 454 operate according to signals received through the isolated capacitively coupled channels from the logic circuit 440 and provide respective gate drive signals OUTA and OUTB connected to gates of respective high side and low side transistors 471 and 472. The high side transistor 471 has a drain terminal 470 connected to a high-voltage supply voltage HV, and a capacitor 474 is connected between the drain terminal 470 and the ground reference node 429. The source terminal of the high side transistor 471 and the drain terminal of the low side transistor 472 are connected to the switching node 434.

Referring also to FIGS. 5-25, FIG. 5 shows a method 500 of fabricating a packaged electronic device including a first die with an isolation component (e.g., a capacitor, transformer, etc.) and multilevel isolation structure in a multilevel metallization structure. FIGS. 6-25 show partial views of the first die 100 of FIGS. 1-4 undergoing fabrication processing according to the method 500. The method 500 shows steps, such as acts and/or events associated with construction of a multilevel metallization structure that incorporates the capacitor 104 and the conductive shield 105. The described steps may concurrently be used for fabricating and interconnection of other electronic circuits and/or components (e.g., transistor circuits to form the logic circuit 440 in FIG. 4, etc.) in a single semiconductor die 100. The multilevel metallization structure 103 in one example includes metal lines, cylindrical vias and trench vias that electrically couple terminals of the isolation component 104 to one or more internal components (not shown).

The method 500 includes front end processing at 502, for example, fabricating one or more circuit components (e.g., transistors, etc.) on and/or in a starting wafer. In the electronic device 100 of FIG. 1, the front end processing at 502 includes processing of a starting semiconductor wafer, such as a p-type silicon wafer, a SOI structure with a silicon layer, a silicon-germanium layer, or another layer having semiconductor material. The processing at 501 in one example also includes fabrication of transistors on and/or in the semiconductor layer 101, and forming isolation structures, such as the illustrated STI structures 102 on and/or in a top side of the semiconductor layer 101.

A FIGS. 9-18 show the metallization structure 103 as formed at 504, 506, 510, 520, 530, and 540 over the semiconductor layer 101. The example method 500 includes forming a pre-metal dielectric layer at 504, as well as forming associated contacts (e.g., tungsten) at 506 to create the PMD level 110. Thereafter, N metallization structure levels of the multilevel metallization structure 103 are fabricated level by level. FIG. 6 shows one example of the processing at 504, in which a deposition process 600 is performed that deposits pre-metal dielectric PMD layer 111 (e.g., $SiO_2$) on the semiconductor layer 101. In one example, the process 600 deposits silicon dioxide to form the PMD layer 111 to a thickness of about 1.2 μm.

The method 500 continues at 506 with formation of contacts (e.g., contacts 114 and 118) through the PMD layer 111. FIG. 7 shows one example, in which a contact formation process 700 is performed that forms cylindrical contacts 114 and pre-metal trench contacts 118 through the PMD layer 111 and on the semiconductor layer 101. In one example, the process 700 includes patterned etching (not shown) to form cylindrical holes and trenches for the respective cylindrical and trench contacts, and one or more deposition steps that deposit suitable metal (e.g., that is or includes tungsten) in the openings, followed by s planarization step (e.g., chemical mechanical polishing or CMP) to provide a planar top side of the PMD layer 111 and the formed respective cylindrical and trench contacts 114 and 118. In one example, the trench formation creates a continuous trench for the pre-metal trench contact 118 that encircles a portion of the first region 196 (FIG. 1 above) of the PMD layer 111, and the corresponding trench and resulting contact 118 extend down onto the semiconductor layer 101 to begin the grounded conductive shield 105 described above. In the example implementation, the cylindrical pre-metal level contacts 114 are electrically coupled with one or more electronic circuit components of the electronic device 100 (e.g., for signal routing in the logic circuit 440 of FIG. 4). In addition, further trench contacts 118 are formed at 506 in the example of FIG. 7 in regions 119 (FIG. 1) near the outer periphery of the illustrated portion of the electronic device 100, for example, to provide protection against cracks and mechanical stress on the device 100, although not a strict requirement of all possible implementations.

Figure 5:
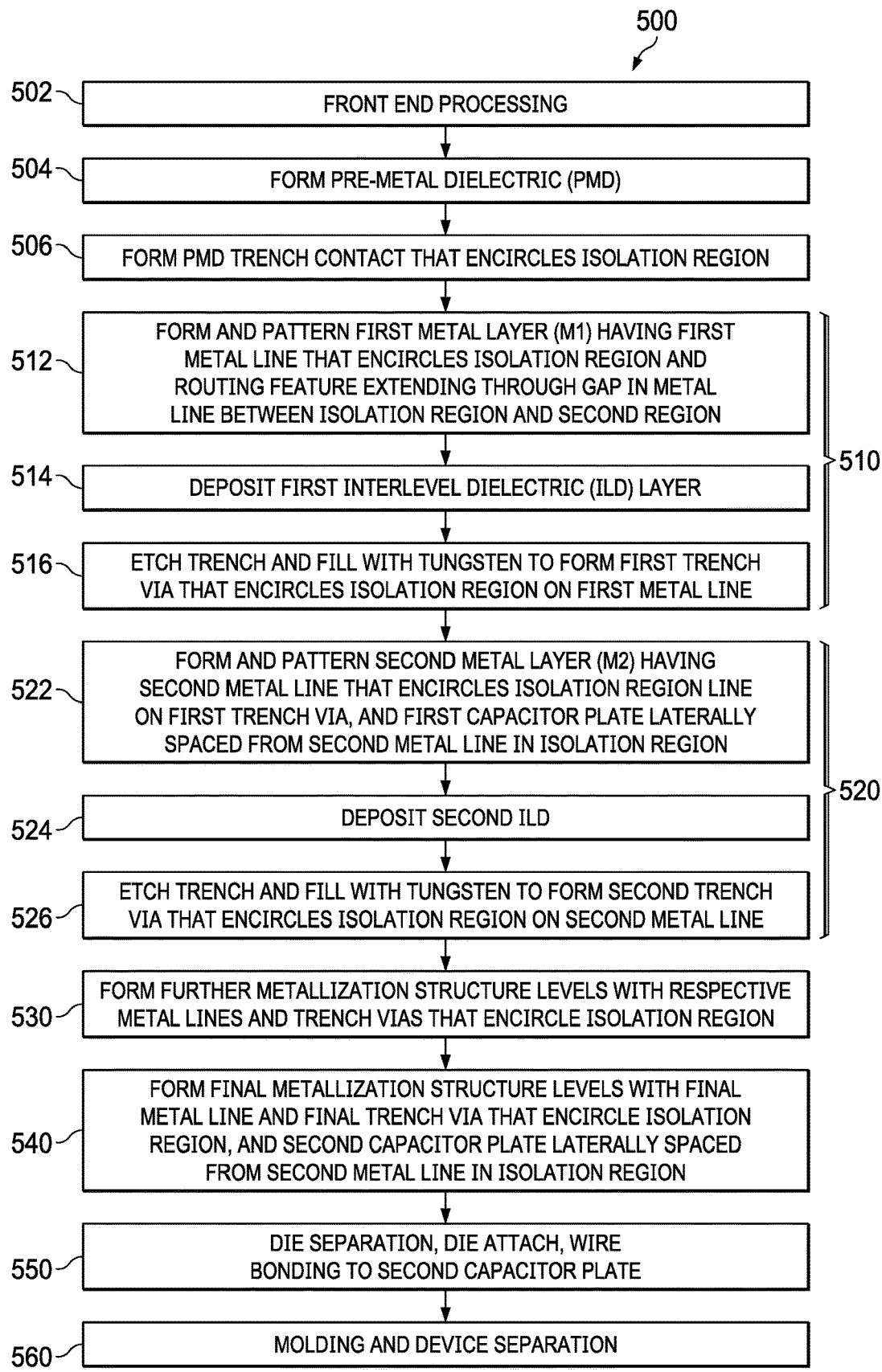
FIG. 5 is a flow diagram of a method of fabricating a packaged electronic device.
Figure 8:
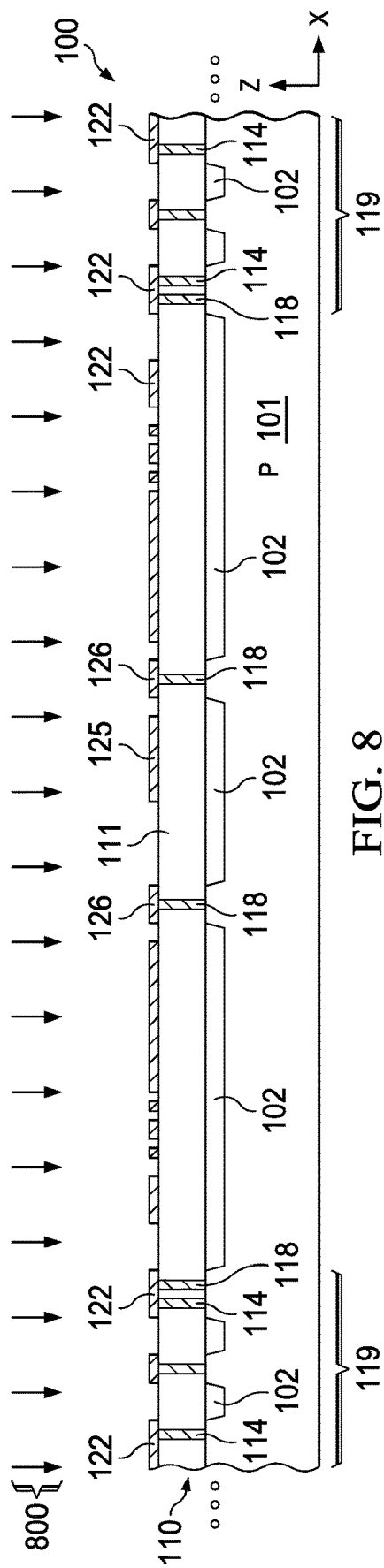
Figure 9:
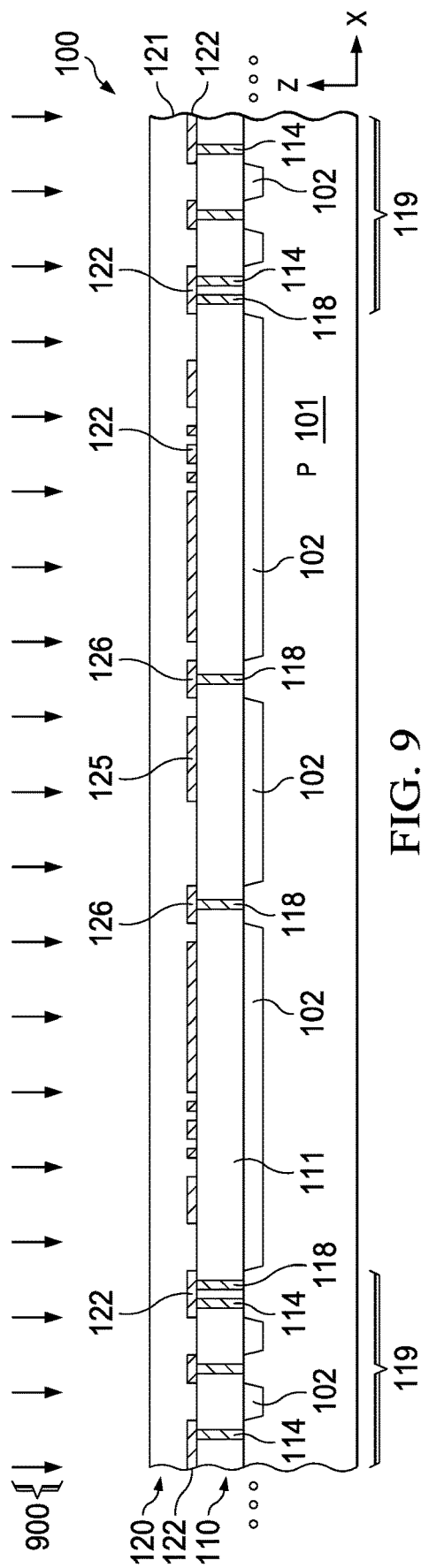

The method 500 continues at 510 in FIG. 5 with forming the first metallization structure level 120 on the PMD layer 111. FIGS. 8 and 9 show an example implementation in which the first metallization structure level 120 is formed at 512 and 514 of FIG. 5. The first metallization structure level 120 includes the first metal line 126 on the pre-metal trench contact 118, the metal routing feature 125. In addition, the metallization structure level 120 includes the first ILD layer 121 on the PMD layer 111, the first metal line 126, and the metal routing feature 125, as well as the routing via 127 and the first trench via 128 on the first metal line 126. As discussed above, the first trench via 128 and the first metal line 126 encircle (except in the gap region where 125 passes through 126 as shown in FIG. 3) the first region 196 of the first metallization structure level 120 within the second region 198 of the first metallization structure level 120, and the metal routing feature 125 extends through the gap G in the first metal line 126 (e.g., FIG. 3 above).

Figure 10:
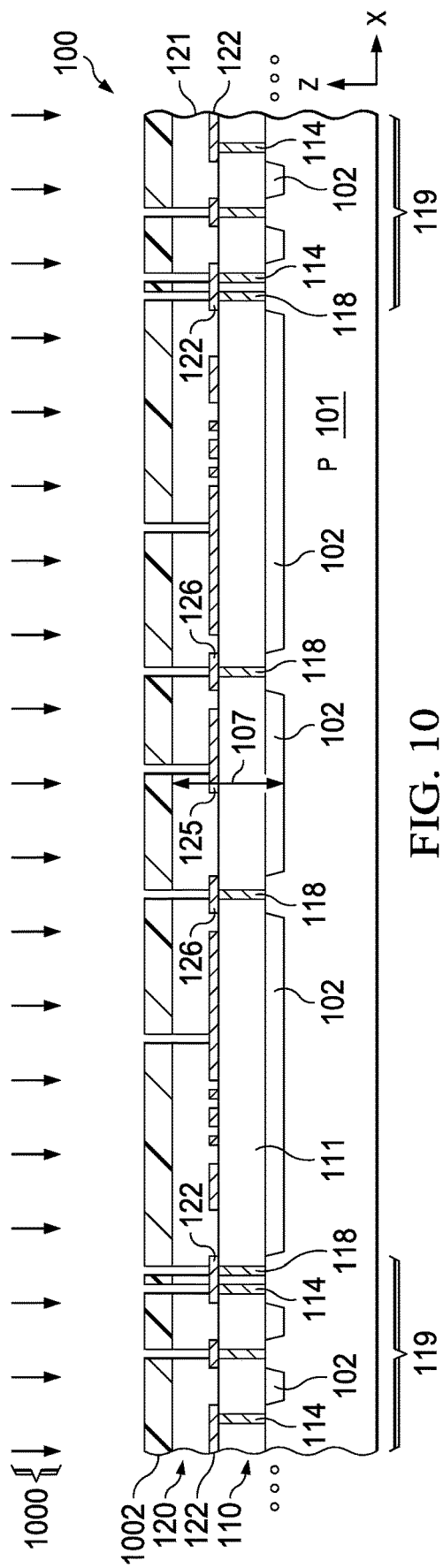
Figure 11:
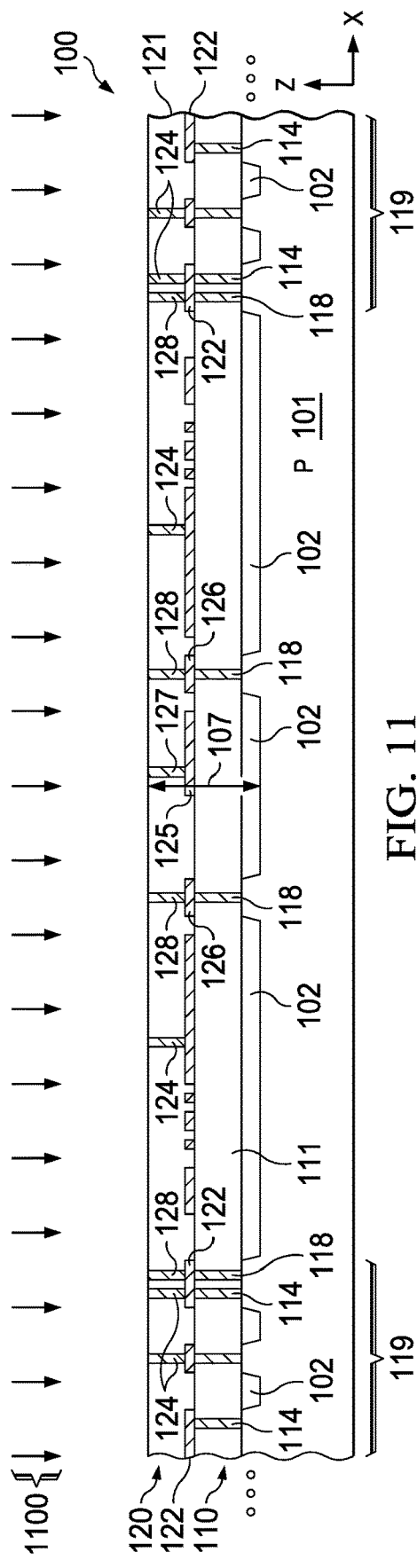

At 512 in FIG. 5, the first metal layer features (M1) are deposited and patterned. FIG. 8 shows one example, in which a process 800 is performed that deposits a metal layer on the PMD layer 111 (e.g., aluminum to a thickness of 0.61 μm), and etches exposed portions of the deposited metal using a patterned etch mask (not shown) to form the metal routing features 122 in the second region (region 198 in FIG. 1 above), as well as the metal routing feature 125 and the first metal line 126 in the first region (196 in FIG. 1). At 514, the first ILD layer 121 is deposited on the PMD layer 111. FIG. 9 shows one example, in which a deposition process 900 is performed that deposits an ILD layer 121 (e.g., silicon dioxide to a thickness of 1.2 μm) on the PMD layer 111. At 516, trenches and cylindrical holes are etched in the deposited ILD layer 121. FIG. 10 shows one example, in which an etch process 1000 is performed using a patterned etch mask 1002. The etch process 1000 forms cylindrical holes for prospective vias and trenches for prospective trench vias. The processing at 516 also includes filling the etched cylindrical holes and trenches with conductive metal (e.g., tungsten) to form the cylindrical routing vias 124 and the trench via 128. FIG. 11 shows one example, in which a deposition process 1100 is performed that deposits tungsten in the etched via holes and trenches to form the cylindrical routing vias 124 and the first trench via 128 on the first metal line 126 to continue the conductive shield 105 in the first metallization structure level 120. In one example, the processing at 510 in FIG. 5 also forms further trench contacts 128 in the regions 119 near the outer periphery of the illustrated portion of the electronic device 100, although not a strict requirement of all possible implementations. In one example, the processing at 510 also includes planarizing after the trenches in via holes are filled.

Figure 12:
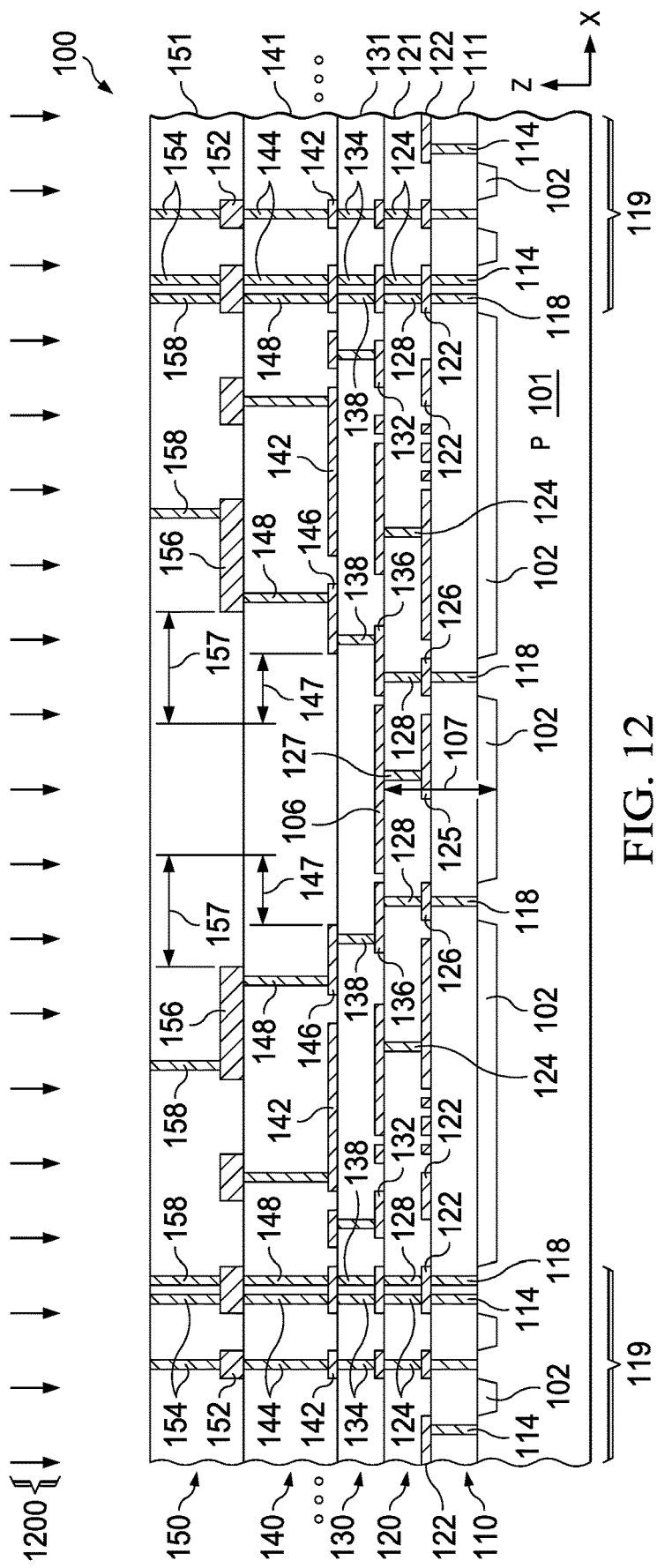

The method 500 continues at 520 in FIG. 5 with forming the second metallization structure level 130 on the first metallization structure level 120. One example includes forming and patterning the second metal layer (M2) at 522 to form the second metal line 136 on the first trench via 128, as well as the first terminal 106 of the isolation component 104 that is laterally spaced from the second metal line 136 and that extends on at least a portion of the routing via 127 in the first portion of the multilevel metallization structure 103. FIG. 12 shows the example electronic device 100 after formation of the second metallization structure level 130, as well as the respective third and fourth metallization structure levels 140 and 150. At 524 in FIG. 5, the second ILD layer 131 is deposited (e.g., silicon dioxide to a thickness of approximately 1.2 μm) on the first ILD layer 121, the second metal line 136, and the first terminal 106. At 526, trenches and cylindrical via holes are etched in the second ILD layer 131, and these are filled with tungsten to form the second trench via 138 on the second metal line 136 and the interconnection vias 134 and the second portion 198 of the multilevel metallization structure 103. In the illustrated example, the second metallization structure level processing at 520 also forms further trench vias 138 in the regions 119 near the outer periphery of the illustrated portion of the electronic device 100, although not a strict requirement of all possible implementations.

Figure 13:
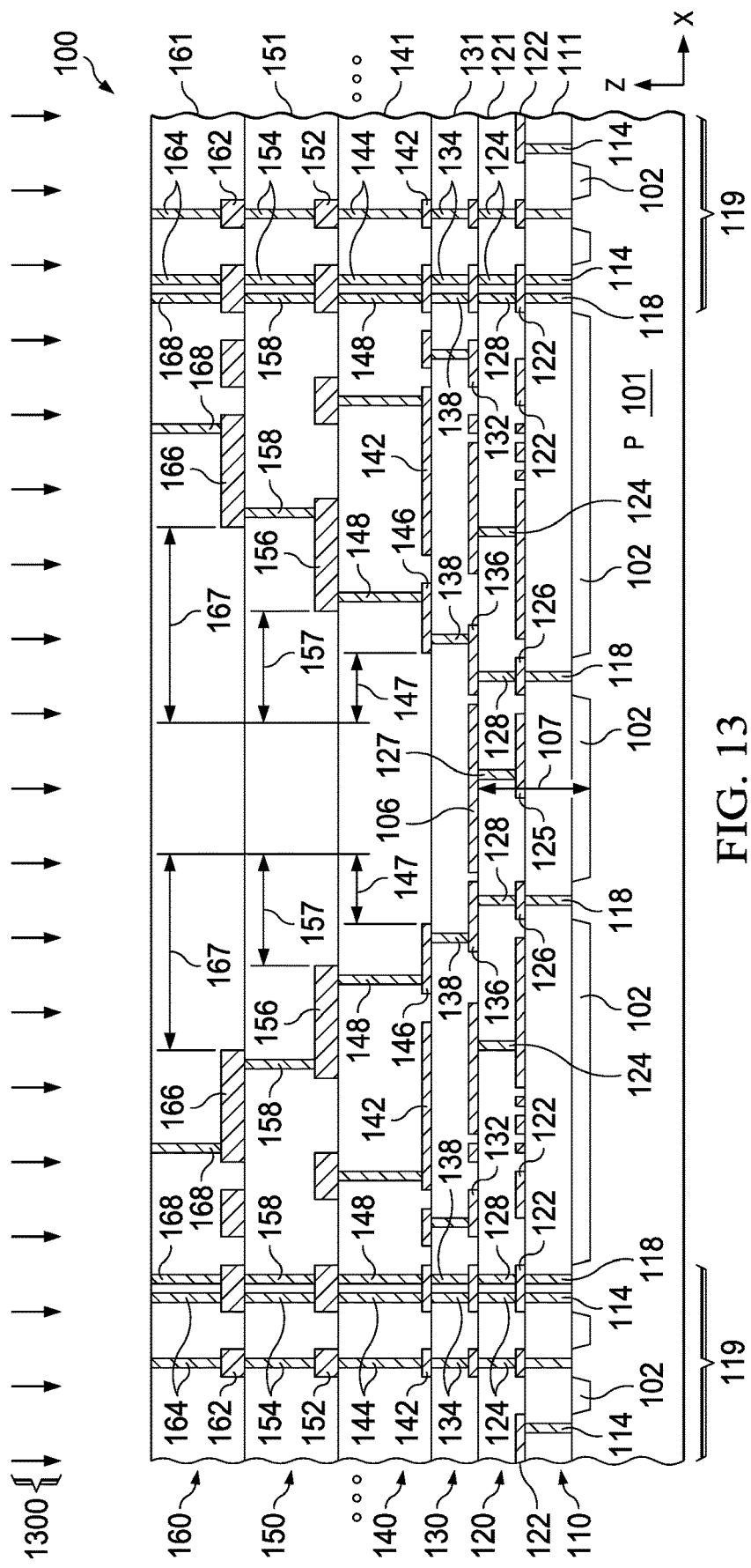

Further metallization structure levels are formed in one example at 530 in FIG. 5. FIG. 12 further shows the third metallization structure level 140 on the second metallization structure level 130 described above, as well as processing 1200 that forms the fourth metallization structure level 150. Any number of intermediate metallization structure levels can be formed at 530, with respective metal lines and trench vias that encircle the first portion 196 of the multilevel metallization structure 103. In the illustrated example, the individual metallization structure levels are created by first depositing and patterning a metal line layer, depositing an ILD layer, chemical-mechanical polishing the ILD layer to remove topography, etching cylindrical via holes and trenches in the ILD layer, and filling the holes and trenches with tungsten, followed by chemical mechanical polishing (e.g., CMP) to remove unwanted tungsten from the ILD surface. FIG. 13 shows processing 1300 (e.g., at 530 in FIG. 5) that forms the example fifth metallization structure level 160 in the electronic device 100.

Figure 14:
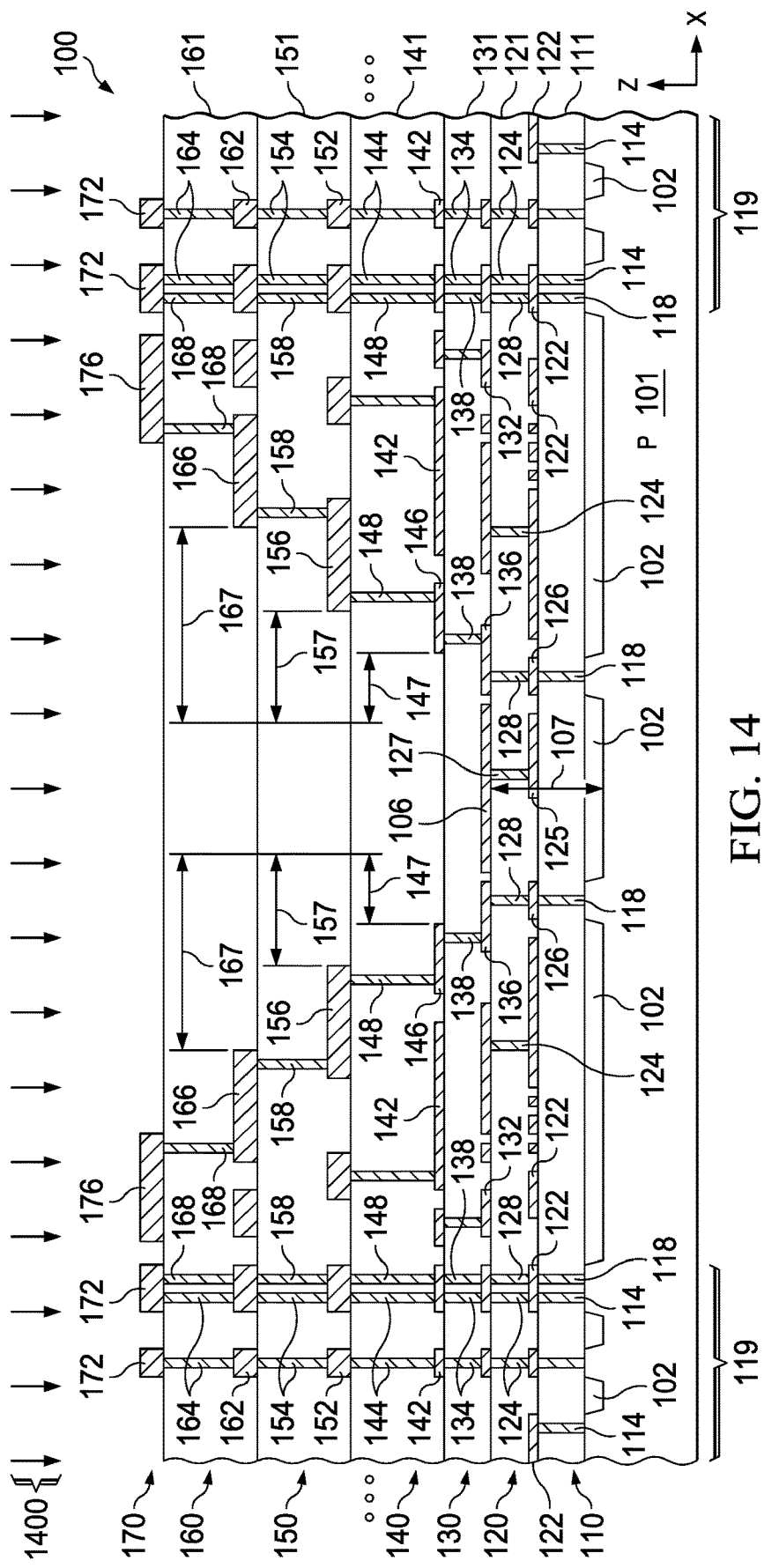
Figure 15:
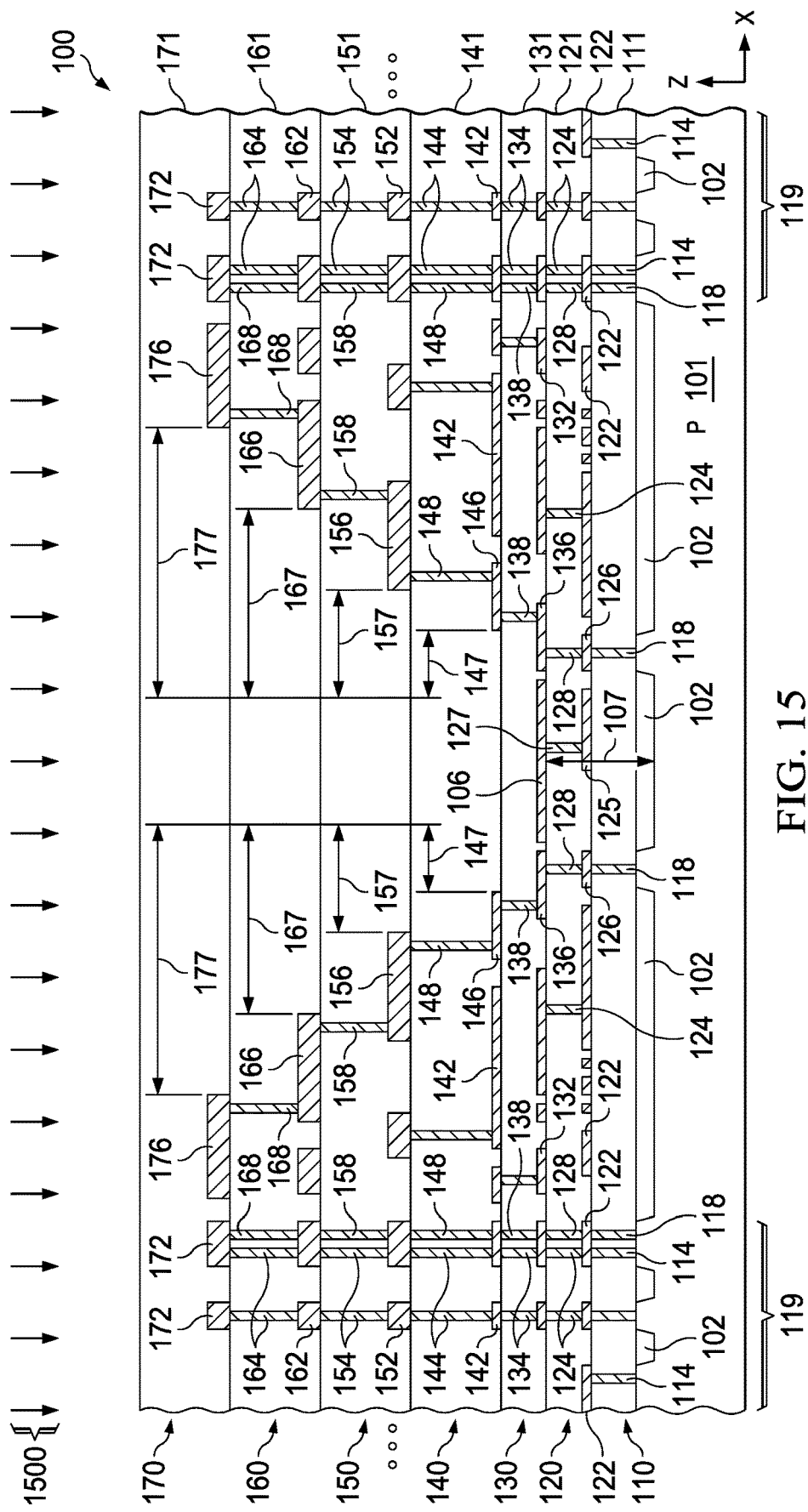

Fabrication of the sixth and seventh metallization structure levels 170 and 180 (at 530 and 540 in FIG. 5) is illustrated in FIGS. 14-24, including a process 1400 in FIG. 14 that deposits and patterns the sixth metal line 176, the sixth level portion of the scribe seal stack 172, and any other sixth metal routing lines between them (not shown). FIG. 15 shows further processing 1500 that deposits the sixth ILD layer 171 over the preceding fifth ILD layer 161, the seventh metal line 176 and the seventh level portions of the scribe seal stack 172.

Figure 16:
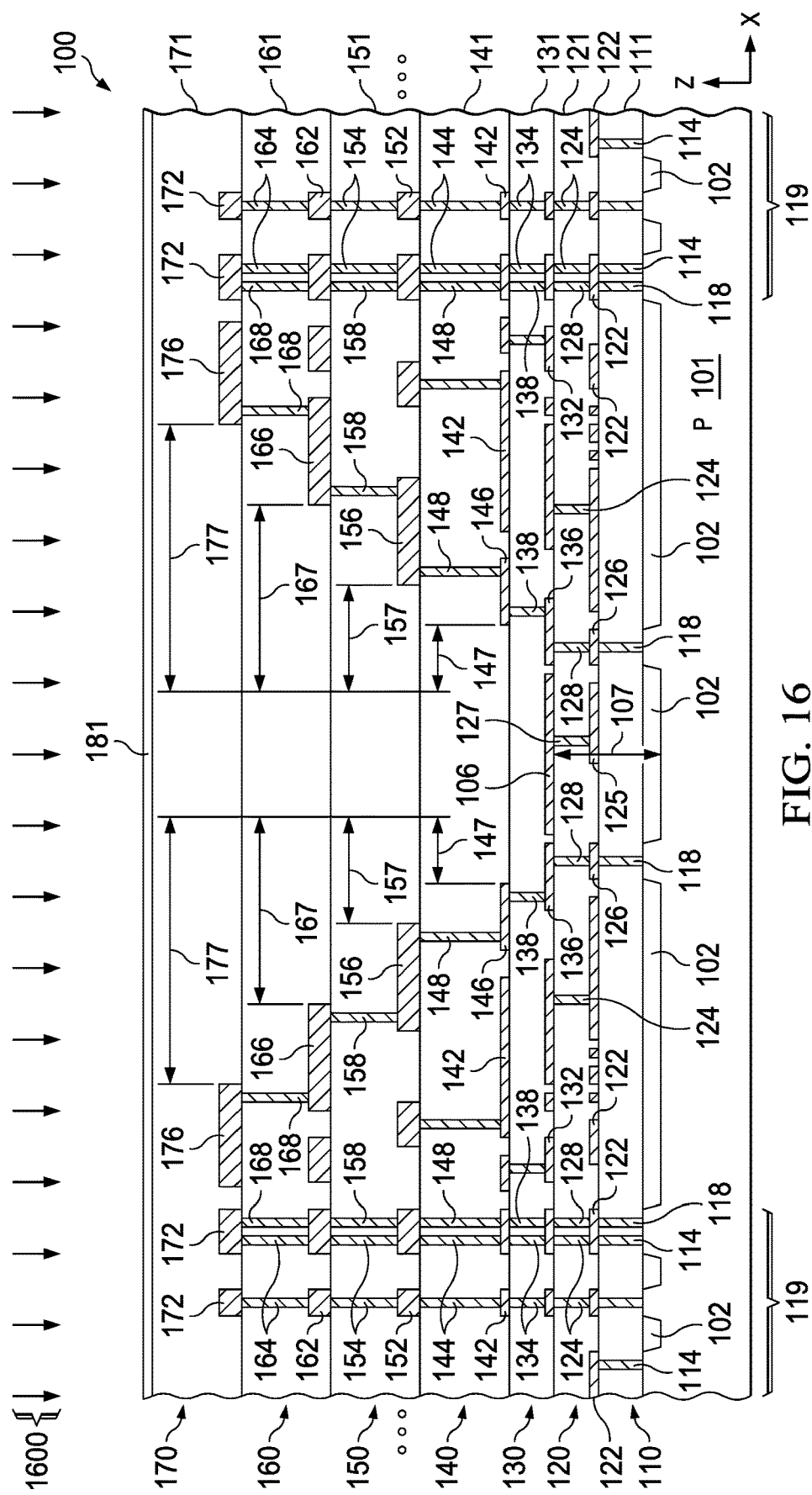
Figure 17:
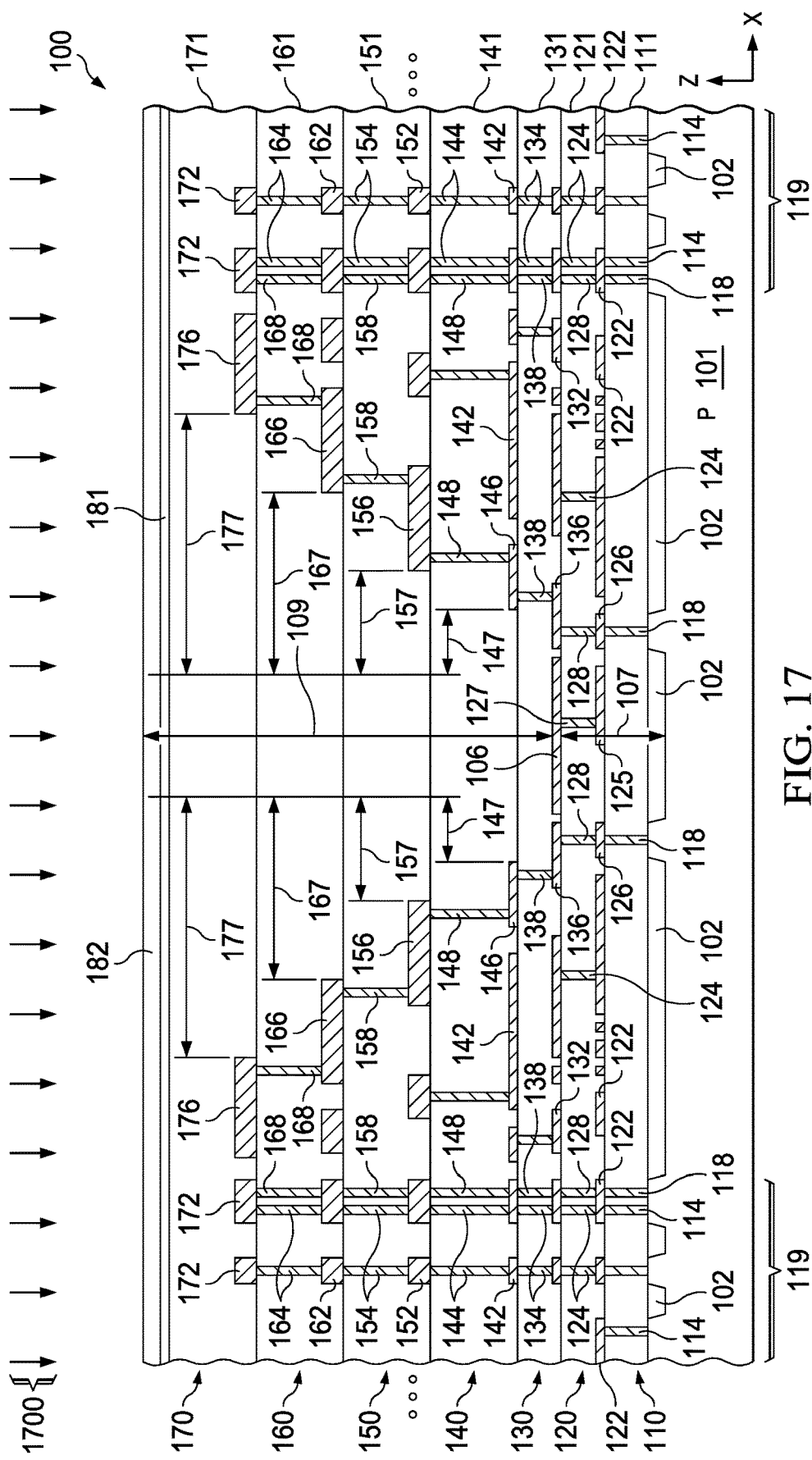
Figure 18:
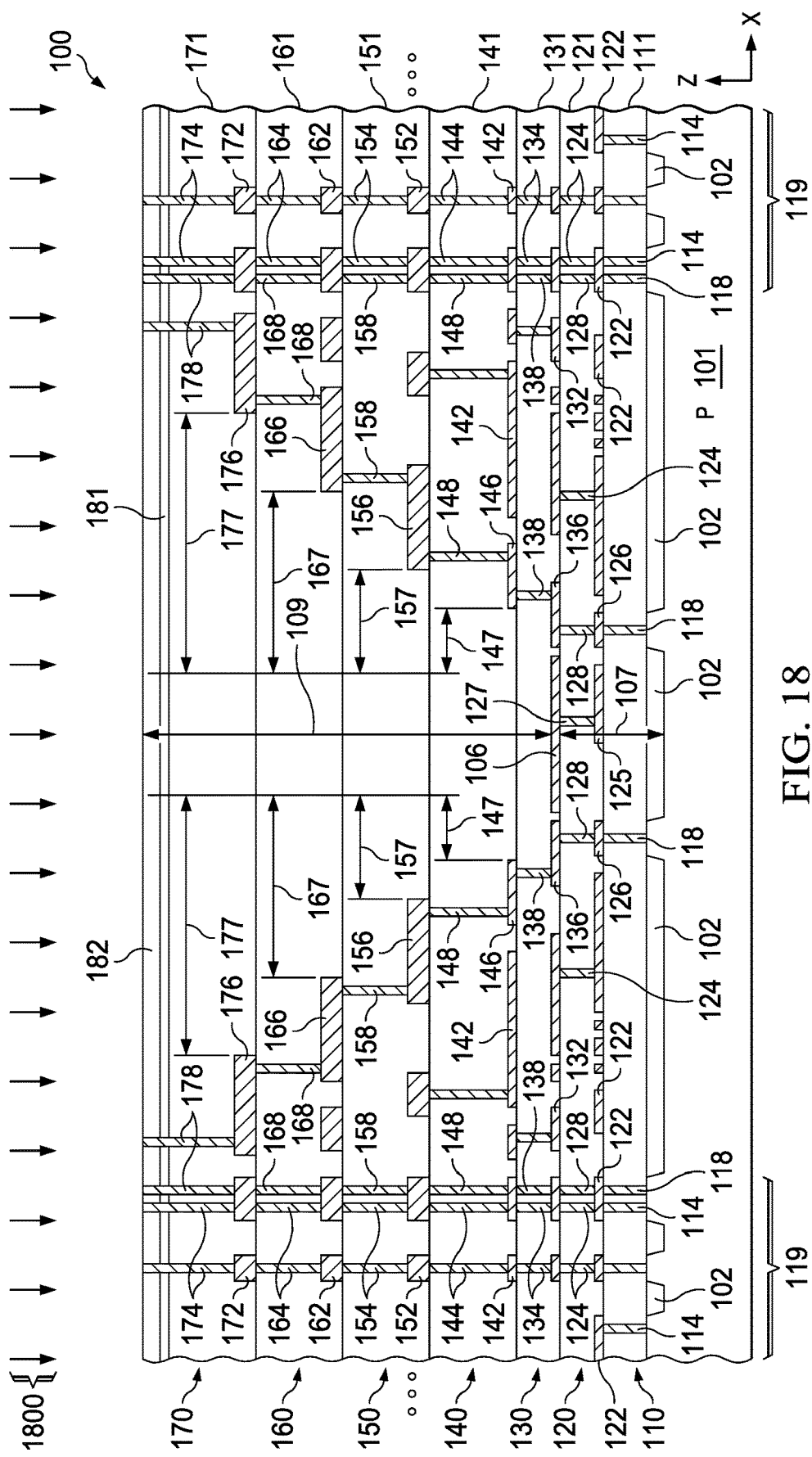
Figure 19:
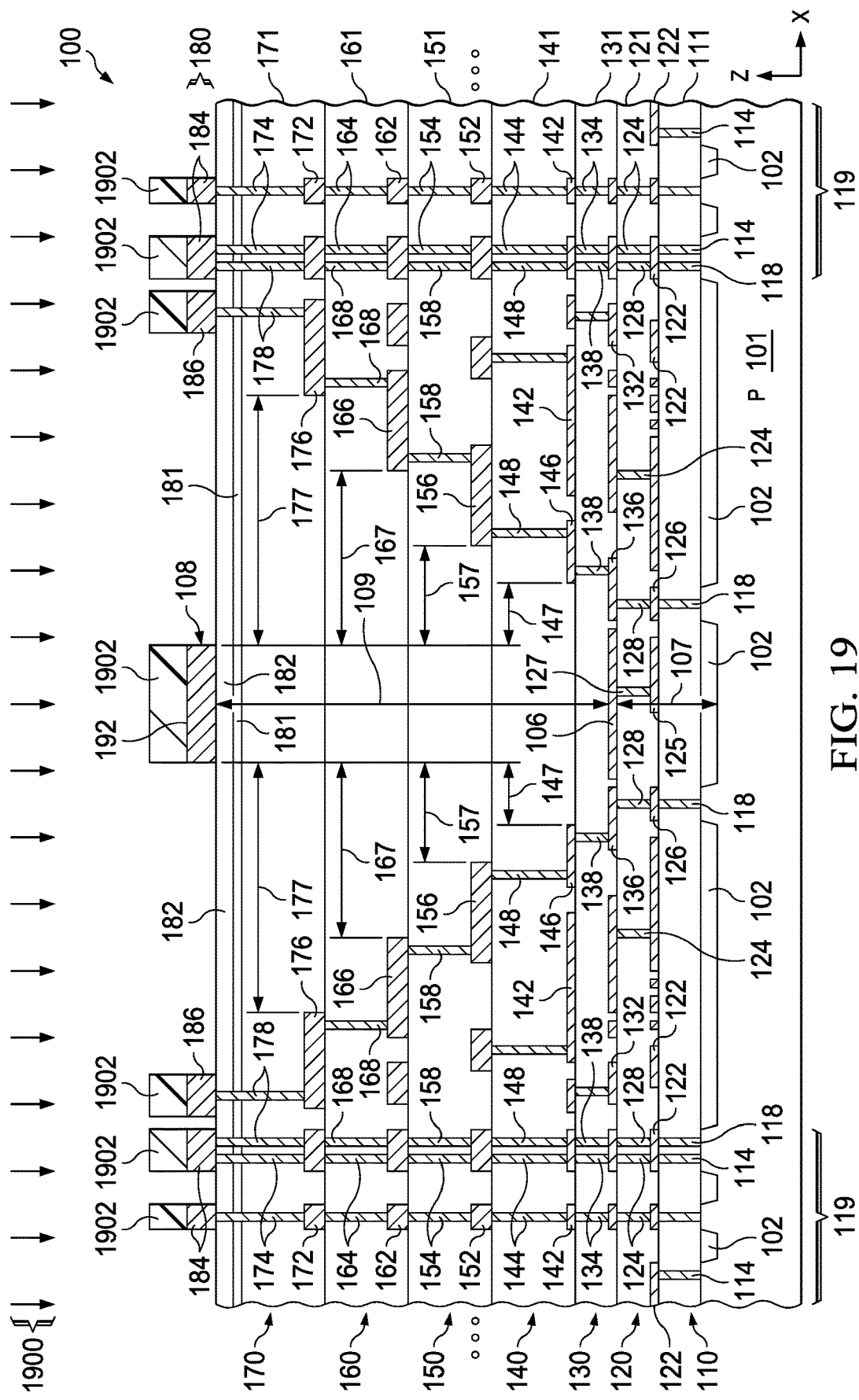

The method 500 also includes forming the final metallization structure level (e.g., the $N^{th}$ metallization structure level 180) at 540 in FIG. 5. The Nth metallization structure level 180 includes the $N^{th}$ metal line 186 on the trench via 178 of the underlying metallization structure level 170, as well as the second terminal 108 of the isolation component 104 and the layer 183 on the $N^{th}$ metal line 186. FIGS. 16 and 17 show respective deposition processes 1600 and 1700 that deposits the dielectric layers 181 and 182. The deposition process 1600 in one example deposits silicon oxynitride 181 to a thickness of approximately 0.3 μm, and the deposition process 1700 deposits silicon nitride 182 two a thickness of approximately 0.65 μm. Processing 1800 in FIG. 18 etches trenches and cylindrical via holes and fills the holes and trenches with tungsten to form the sixth trench via 178 and the sixth cylindrical tungsten vias 174 in the second portion of the multilevel metallization structure 103. FIG. 19 illustrates an etch process 1900 after deposition of the top metallization layer with an etch mask 1902 that etches exposed portions of the top metallization payer to form the structures 108, 184 and 186.

Figure 20:
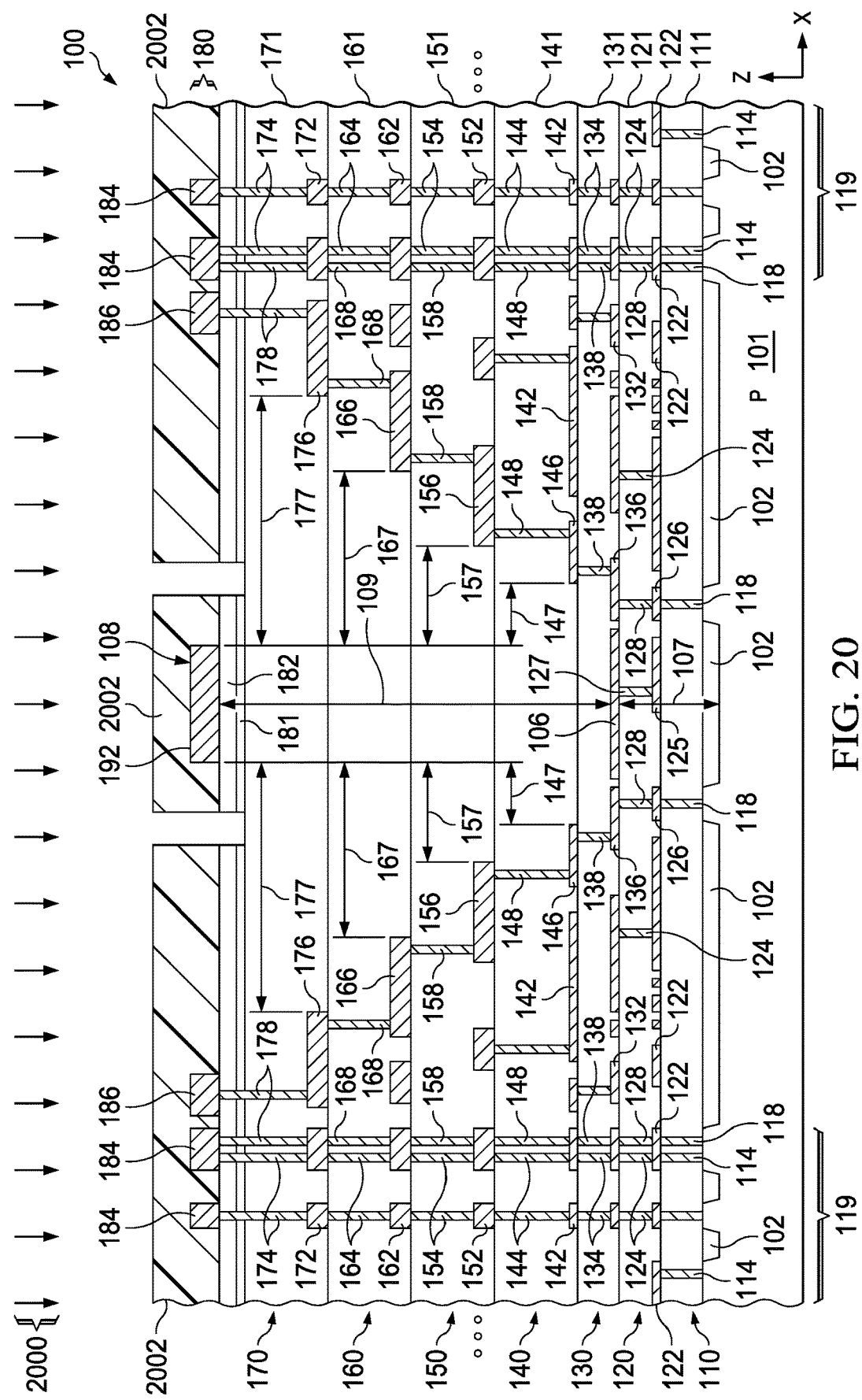
Figure 21:
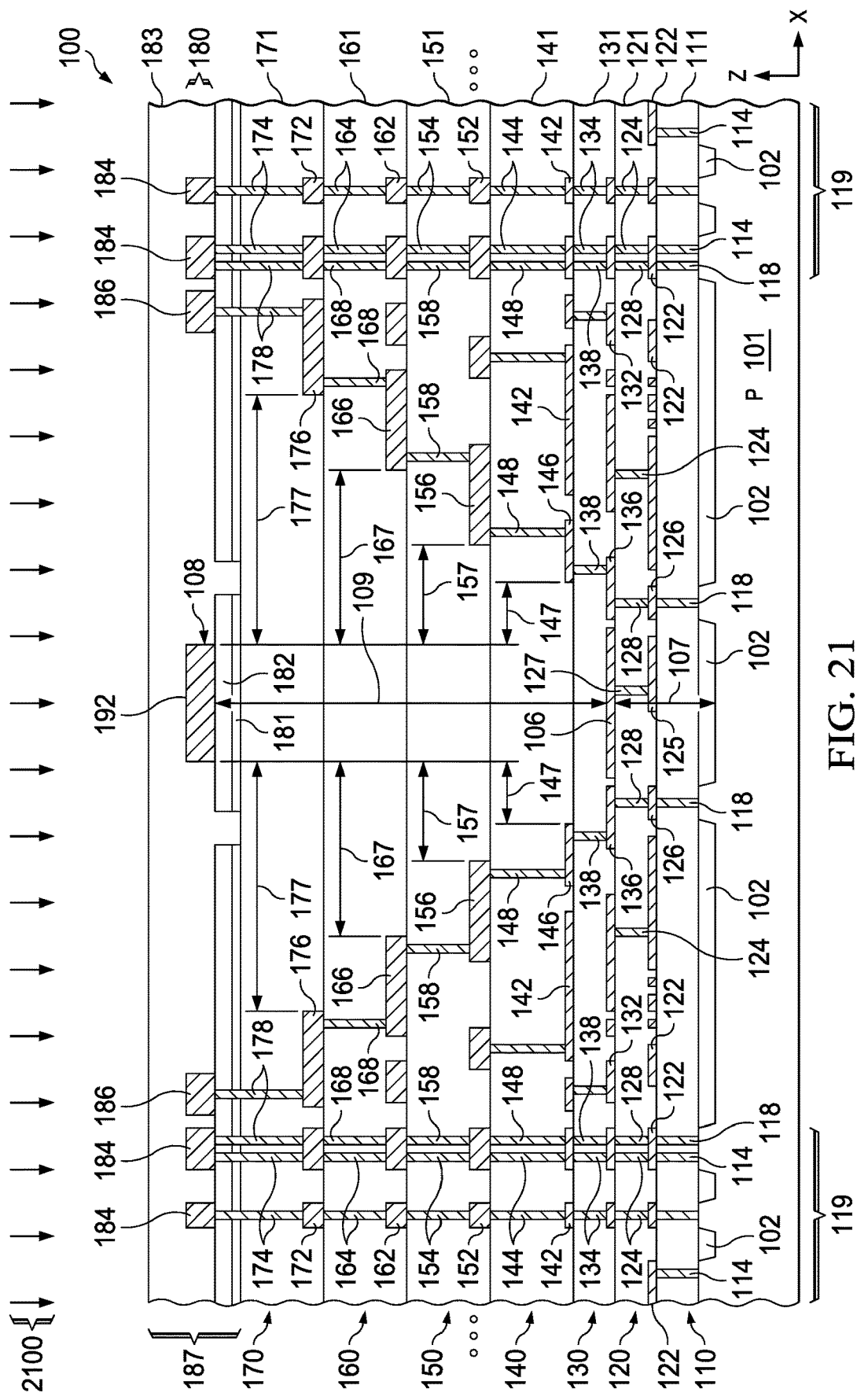
Figure 22:
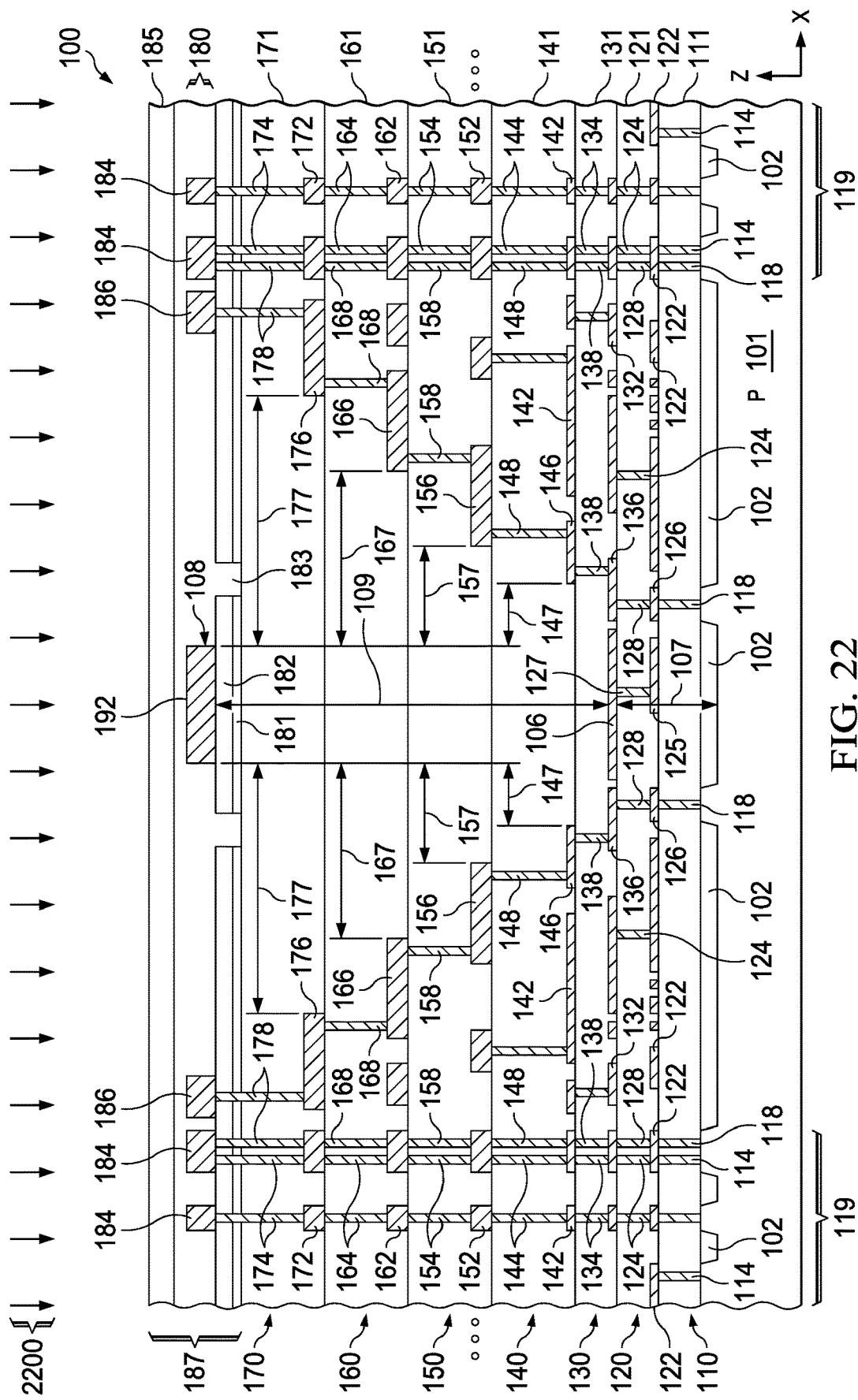
Figure 23:
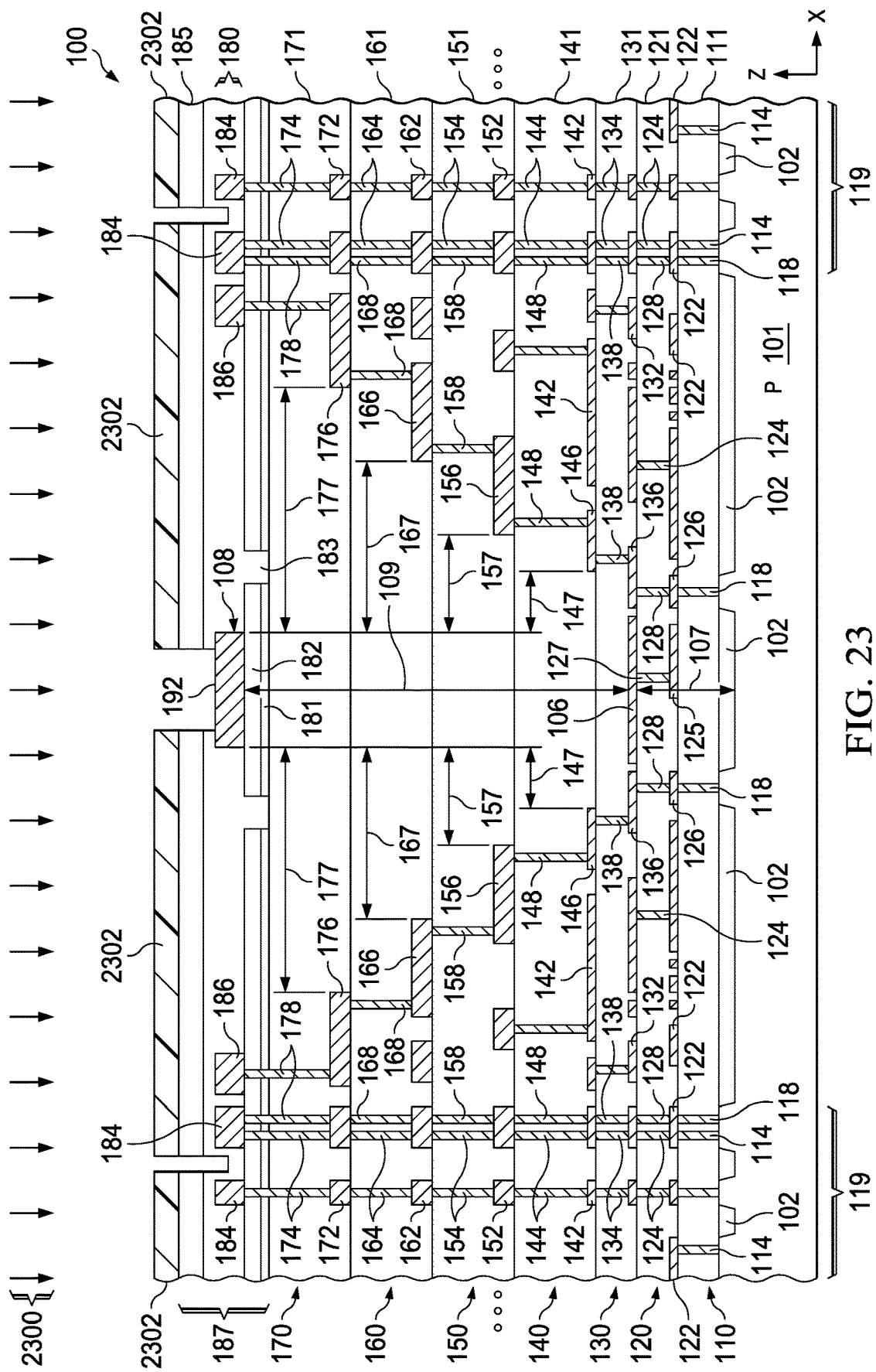
Figure 24:
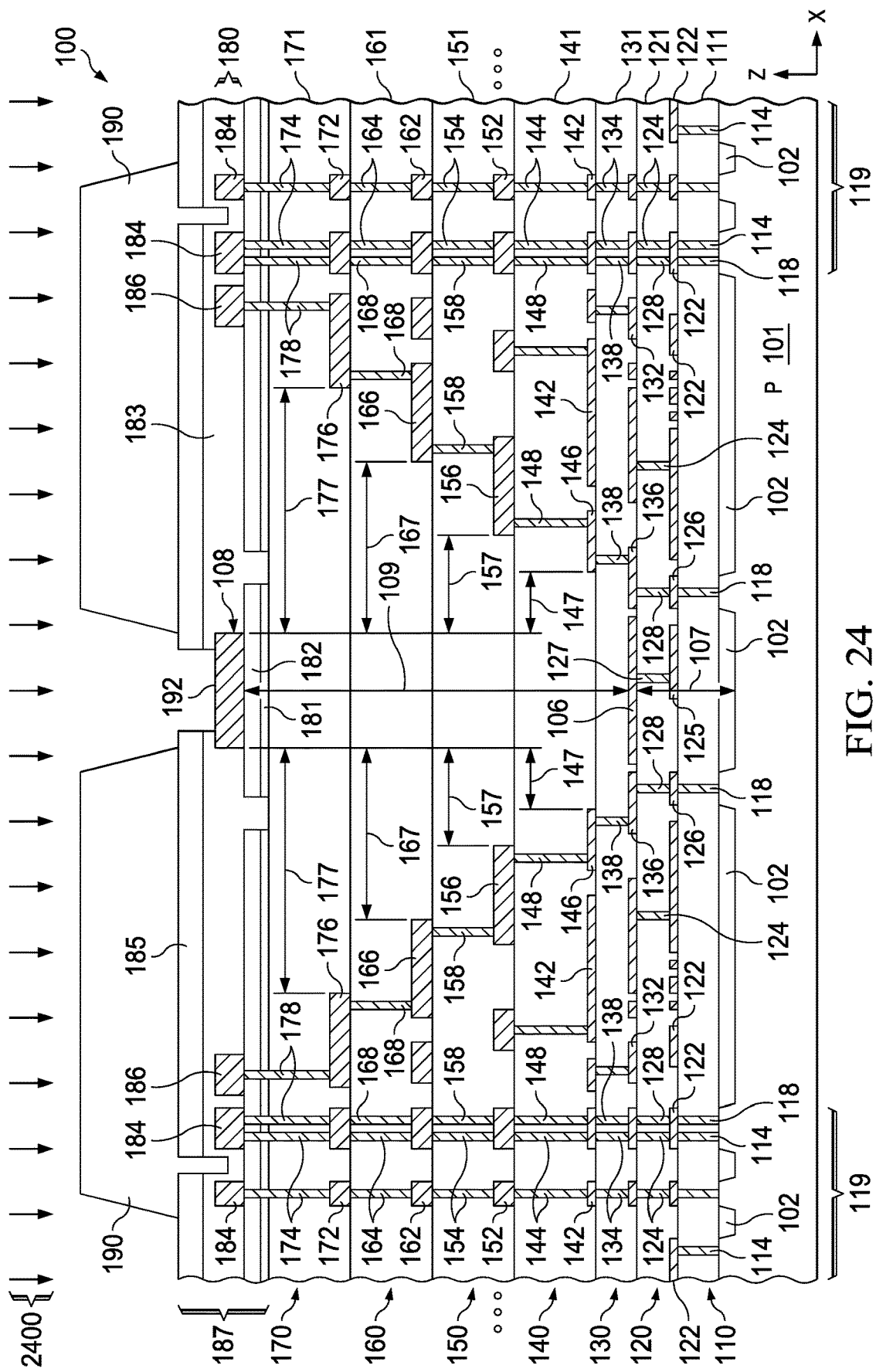

Formation of the level 180 continues in FIG. 20 with etch processing 2000 using a mask 2002 that etches the layers 182 and 181 to expose portions of the top of the sixth ILD layer 171. A portion of the protective overcoat layer 183 is deposited on the $N^{th}$ metal line 186 by a sequence of deposition processes 2100 in FIG. 21 (e.g., silicon dioxide with a thickness of 1.5 μm deposited by high density plasma (HDP) followed by silicon dioxide with a thickness of 3.6 μm deposited by plasma enhanced chemical deposition (PECVD). The bilayer 183 deposited by process sequence 2100 is then chemically mechanically polished to within 1.5 μm of the layer 180 to remove topography. In FIG. 22, a deposition process 2200 is performed that deposits a final layer 185 that, together with 183, forms a protective overcoat (PO) stack for the device 100. In one example, the process deposits silicon oxynitride 185 to a thickness of approximately 2.8 μm. In FIG. 23, an etch process 2300 is performed with an etch mask 2302. The etch process 2300 etches openings in the protective overcoat stack, including an opening that exposes the top side 192 of the second terminal 108 of the capacitor isolation component 104. In FIG. 24, a dispense or screening process 2400 is performed that forms the polyimide layer 190 (e.g., to a thickness of approximately 10 μm) over portions of the protective overcoat stack 187 to create a stress barrier to mitigate mechanical stress on the semiconductor layer 101 and the multilevel metallization structure 103. As shown in FIG. 24, the polyimide layer 190 has a gap that exposes the top side 192 of the second terminal 108.

Figure 25:
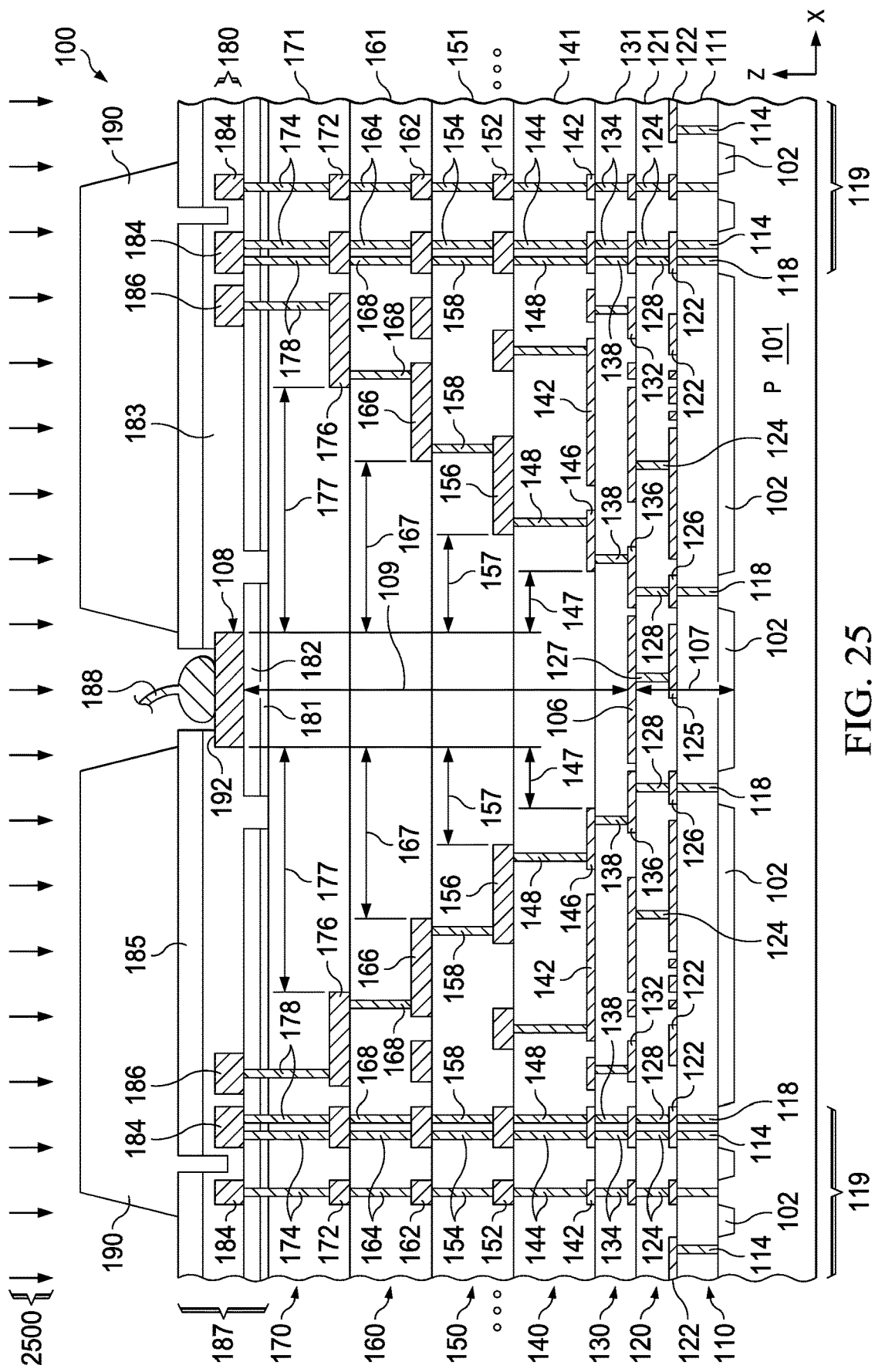
Figure 26:
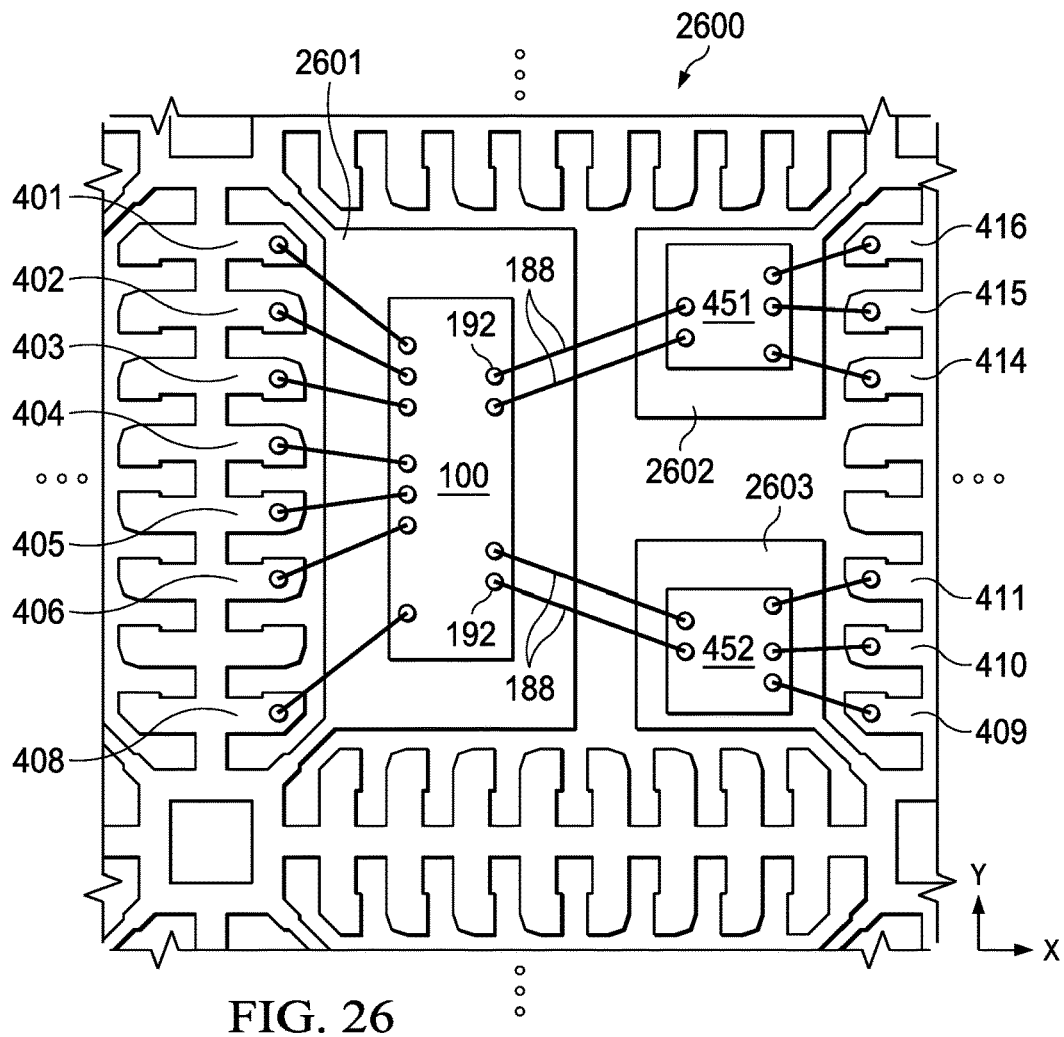
FIG. 26 is a partial top plan view showing a portion of a lead frame with attached semiconductor dies undergoing a wire bonding.
Figure 27:
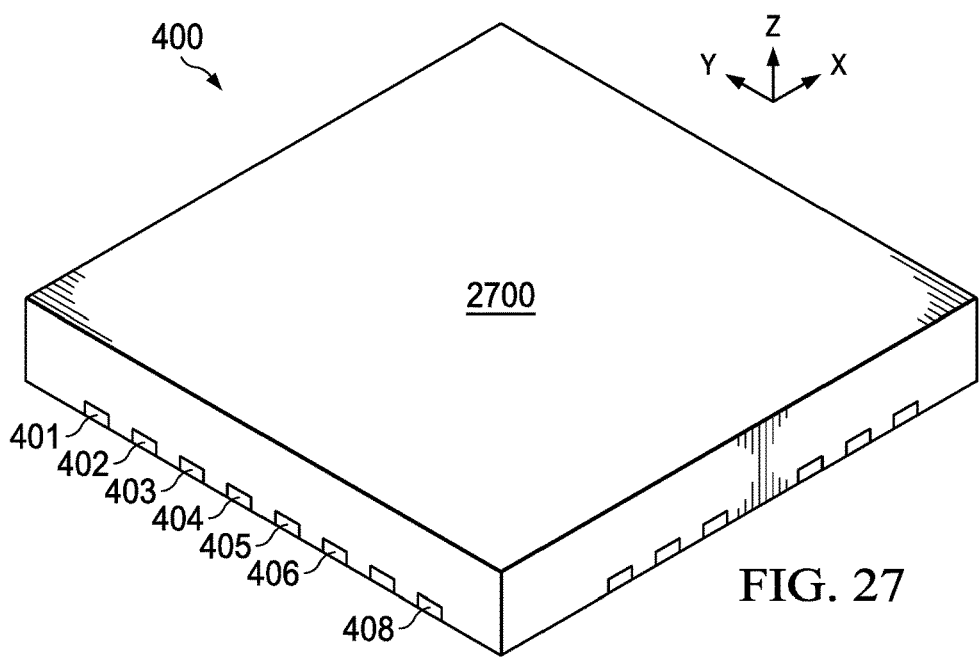
FIG. 27 is a perspective view of a packaged electronic device.

Referring also to FIGS. 25-27, the method 500 continues at 550 with separating a first semiconductor die (e.g., die 100 in FIG. 4 above) including the semiconductor layer 101 and the multilevel metallization structure 103 from a wafer. In addition, the die is attached to a lead frame and wire bonding processing is performed at 550 to provide electrical connection to the second capacitor terminal 108. FIG. 26 shows a packaged electronic device during processing at 550, in which the semiconductor die 100 is attached to a first die attach pad 2601 of a lead frame structure 2600 having the leads or terminals 401-406, 408-411 and 414-416 as previously described. The die attach processing at 550 in this example also includes attaching the dies 451 and 452 (e.g., FIG. 4 above) to respective die attach pads 2602 and 2603 of the lead frame. Bond wires are connected (e.g., welded, ultrasonically soldered, etc.) between conductive features of the dies 100, 451, 452 and/or to specific ones of the leads 401-406, 408-411 and 414-416. As shown in FIGS. 4, 25, and 26, the wire bonding also bonds the above described wires 188 to the exposed top side 192 of the respective second terminal 108 of the capacitor isolation component 104. In this example, the second end of the bond wires 188 are respectively coupled to the corresponding second capacitor plates 108 of the dies 451 and 452 in order to create series connected capacitor coupling between the driver outputs of the first die 100 and the circuitry of the dies 451 and 452. Other electrical connection technologies can be used at 550, such as ball grid arrays or solder ball connections to conductive features of substrates, etc., to form an electrical connection at 550 between the second terminal 108 of the isolation component 104 and a conductive feature of a second semiconductor die. The method 500 also includes molding and device separation at 560 in FIG. 5. FIG. 27 shows a molded and singulated packaged electronic device 400 including a molded package structure 2700 (e.g., molding compound) that encloses the dies 100, 451 and 452, the electrical connections 188, and exposes portions of the conductive leads or terminals 401, 402, 403, 404, 405, 406, 408 along one or more sides of the package structure 2700. The example of FIG. 27 is a quad flat no lead (QFN) packaged device 400. In another example, different package types and forms are possible, and the method 500 in one example also includes lead trimming and forming to provide finished packaged electronic devices with gull-wing leads, J-type leads, etc.

The packaged electronic device 2700 and the electronic device 100 described above provide advanced high-voltage isolation barriers with protection between first and second portions 196 and 198 using the conductive shield 105 formed in the multilevel metallization structure 103 and in the top metal layer during metallization processing. The conductive shield 105 provides robust protection of the enclosed isolation barrier capacitor component 104 against nearby EOS events by enhanced circumscribing ground rings formed by the trench contacts/vias 118, 128, 138, 148, 158, 168, and 178 in combination with the connected metal lines 126, 136, 146, 156, 166, 176, 178, and 186. In the illustrated example, trench contacts/vias 118, 128, 138, 148, 158, 168, and 178 are provided at all levels of the multilevel metallization structure 103, although not a strict requirement of all possible implementations. In one example, there are no trenched contact and via levels 118 and 128. In addition, the example conductive shield 105 is grounded by connection through the lowermost trench vias 118 to the semiconductor layer 101, although not a requirement of all possible implementations. The disclosed examples mitigate risk of loss of isolation integrity of the device in the event of an EOS occurrence by creating a wall of metal that substantially, fully or at least partially surrounds the high-voltage isolation component 104 to mitigate cracking in response to EOS events, e.g., surrounds at least 90% of the perimeter area with a tapered or vertical wall of metal surrounding a component. In one example, the trench vias surrounding the HV region include occasional breaks to partially surround the high voltage component or device, for example, where the via 1 and 2 structures match up with the break in the first metal level to allow the connection to the bottom plate. The described EOS protection, moreover, does not require the addition of further circuit components, such as fuses or other one-time use devices in the fabrication of packaged electronic devices.

Figure 28:
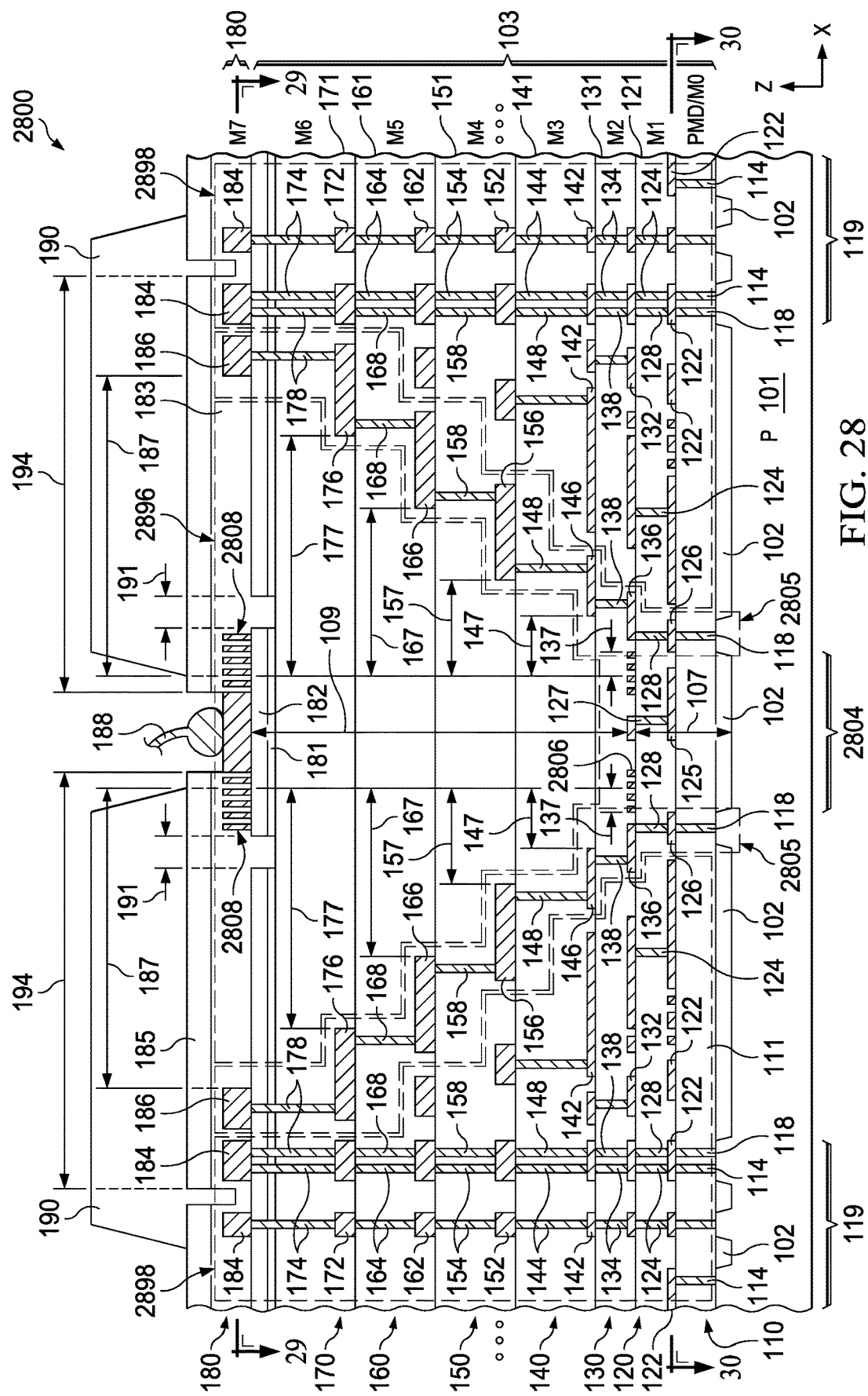
FIG. 28 is a partial sectional side elevation view of another electronic device with an isolation transformer in a first region encircled by a conductive shield in a multilevel metallization structure above a semiconductor layer.
Figure 29:
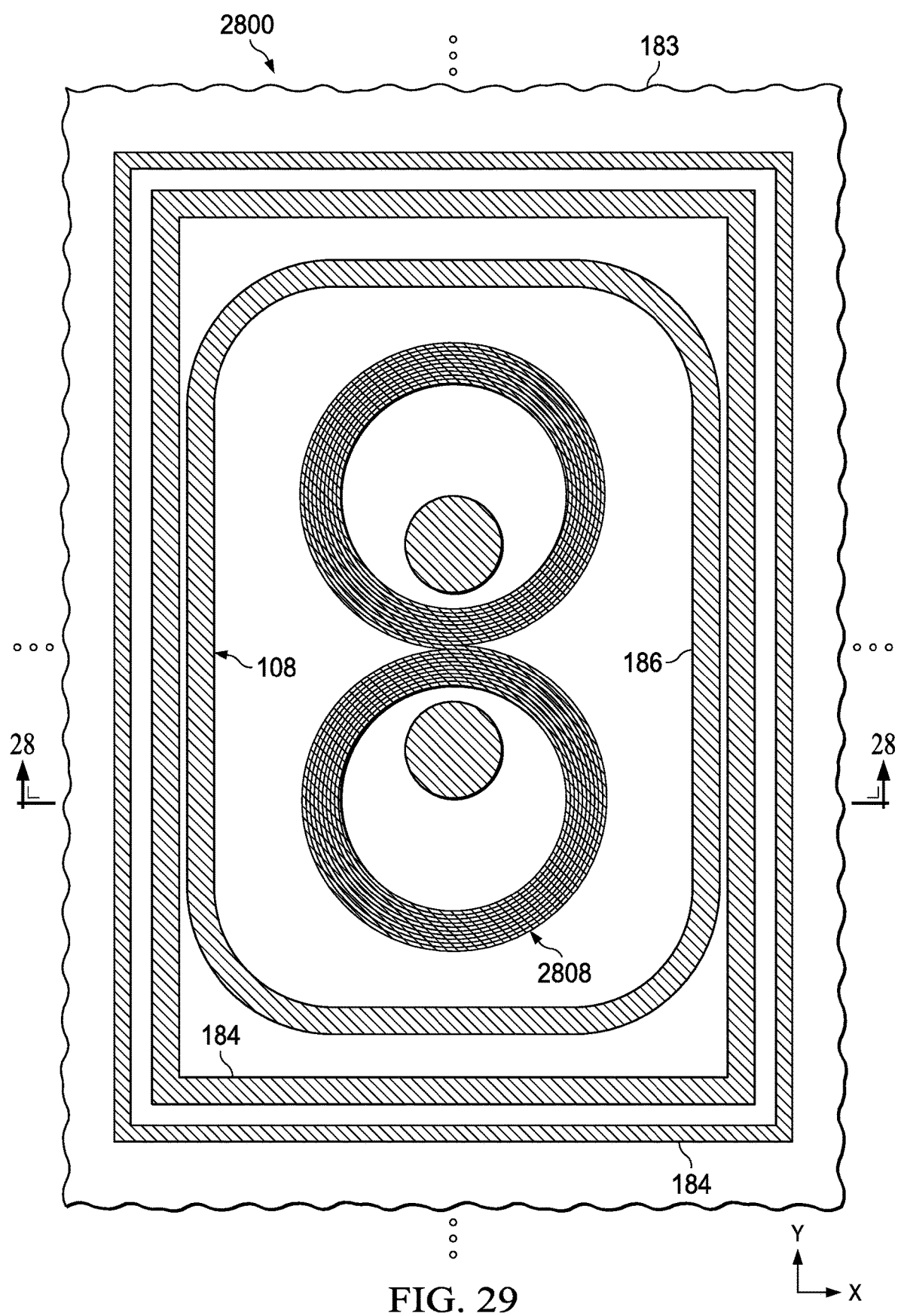
FIG. 29 is a partial top plan view taken along line 29-29 in the electronic device of FIG. 28.
Figure 30:
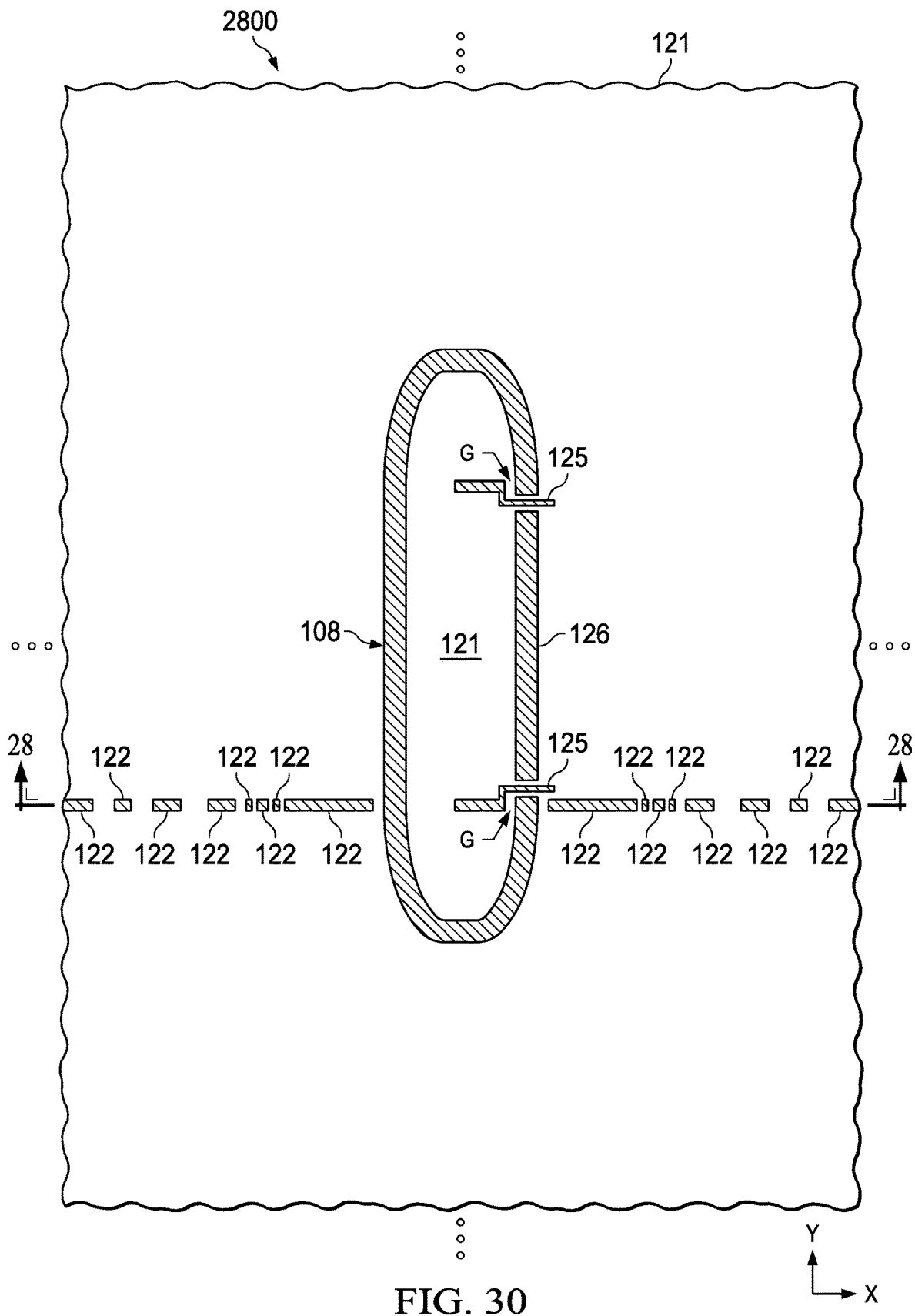
FIG. 30 is a partial top plan view taken along line 30-30 in the electronic device of FIG. 28.

Referring also to FIGS. 28-30, FIG. 28 shows a sectional side view of another electronic device 2800 with an isolation transformer isolation component 2804 in a first region 2896 encircled by a conductive shield 2805 in the multilevel metallization structure 103 above the semiconductor layer 101. FIG. 29 shows a partial sectional top plan view taken along line 29-29 in the electronic device 2800 of FIG. 28, and FIG. 30 shows a partial top plan view taken along line 30-30 in the electronic device 2800 of FIG. 28. The electronic device 2800 includes similarly numbered structures and dimensions as those described above in connection with FIGS. 1-3. In this example, the isolation component 2804 is a transformer with a first terminal 2806 formed as a transformer winding or first transformer coil in the second metallization structure level 130. The second terminal 2808 in this example is a second transformer coil or second transformer winding, as shown in FIG. 29, and the first coil (first terminal) 2806 has a similar shape in one example. The conductive shield 2805 separates the high-voltage first region 2896 from a low-voltage domain second region 2898 using conductive metal lines and trench vias as described above. As further shown in FIG. 30, two gaps are formed in the first metal line 126 in order to provide first and second routing structures 125 that connect to respective first and second ends of the primary transformer coil 2806, and the seventh metallization structure level 180 in this example provides exposed portions of first and second ends of the secondary transformer coil 2808 for electrical connection to an external device (e.g., to another die in a packaged electronic device, not shown).

The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:

1. An electronic device, comprising:
   a semiconductor layer;
   a multilevel metallization structure over the semiconductor layer, the multilevel metallization structure including a first region, a second region, a pre-metal level on the semiconductor layer, and an integer number N metallization structure levels over the pre-metal level, N being greater than 3;
   an isolation component in the first region of the multilevel metallization structure, the isolation component including a first terminal and a second terminal, the first and second terminals being in different respective metallization structure levels of the multilevel metallization structure; and
   a conductive shield between the first region and the second region in the multilevel metallization structure, the conductive shield including interconnected metal lines and trench vias in the respective metallization structure levels that at least partially encircle the first region of the multilevel metallization structure.

2. The electronic device of claim 1, wherein a given one of the metallization structure levels of the multilevel metallization structure includes:
   a respective one of the metal lines that encircles a portion of the first region of the multilevel metallization structure, the respective one of the metal lines including a gap; and
   a metal routing feature spaced from the conductive shield and connected to the first terminal of the isolation component in the first region of the multilevel metallization structure, the metal routing feature extending through the gap of the respective one of the metal lines from the first region of the multilevel metallization structure to the second region of the multilevel metallization structure.

3. The electronic device of claim 2, wherein:
   the isolation component is a capacitor;
   the first terminal of the isolation component is a first capacitor plate connected to the metal routing feature; and
   the second terminal of the isolation component is a second capacitor plate.

4. The electronic device of claim 2, wherein:
   the isolation component is a transformer;
   the first terminal of the isolation component is a first transformer coil connected to the metal routing feature; and
   the second terminal of the isolation component is a second transformer coil.

5. The electronic device of claim 2, further comprising a second isolation component spaced from the isolation component in the first region of the multilevel metallization structure, the second isolation component including a first terminal and a second terminal, the first and second terminals of the second isolation component being in different respective metallization structure levels of the multilevel metallization structure;
   wherein:
   the respective one of the metal lines of the given one of the metallization structure levels includes a second gap; and
   the given one of the metallization structure levels includes a second metal routing feature spaced from the conductive shield and connected to the first terminal of the second isolation component in the first region of the multilevel metallization structure, the second metal routing feature extending through the second gap of the respective one of the metal lines from the first region of the multilevel metallization structure to the second region of the multilevel metallization structure.

6. The electronic device of claim 2, wherein the conductive shield includes a staircase shape, in which:
the second terminal of the isolation component includes opposite lateral edges spaced from one another along a first direction;
the metal lines of the respective metallization structure levels include lateral edges spaced from the respective lateral edges of the second terminal along the first direction by respective spacing distances; and
the respective spacing distances are different from one another.

7. The electronic device of claim 1, wherein the multilevel metallization structure includes:
a pre-metal level, including: a pre-metal dielectric (PMD) layer on the semiconductor layer; and a pre-metal trench contact on the semiconductor layer, the pre-metal trench contact encircling a portion of the first region of the PMD layer;
a first metallization structure level on the pre-metal level, the first metallization structure level including: a first metal line on the pre-metal trench contact; a metal routing feature; a first interlevel dielectric (ILD) layer on the PMD layer, the first metal line, and the metal routing feature; a first trench via on the first metal line, the first trench via and the first metal line encircling another portion of the first region of the first metallization structure level; and a routing via on the metal routing feature; the metal routing feature extending through a gap in the first metal line between the portion of the first region and a portion of the second region of the first metallization structure level; and
a second metallization structure level on the first metallization structure level, the second metallization structure level including: a second metal line on the first trench via; the first terminal of the isolation component, spaced from the second metal line; a second ILD layer on the first ILD layer, the second metal line, and the first terminal of the isolation component; and a second trench via on the second metal line, the second trench via and the second metal line encircling a second portion of the first region of the second metallization structure level.

8. The electronic device of claim 7, wherein the multilevel metallization structure further includes:
an $N^{th}$ metallization structure level of the N metallization structure levels above the second metallization structure level, the Nth metallization structure level including: an $N^{th}$ metal line on a trench via of an underlying metallization structure level; the second terminal of the isolation component, spaced from the $N^{th}$ metal line; and an $N^{th}$ ILD layer on the $N^{th}$ metal line, the $N^{th}$ metal line encircling an $N^t$ portion of the first region of the $N^{th}$ metallization structure level; and
one or more intermediate ones of the metallization structure levels between the second metallization structure level and the $N^{th}$ metallization structure level, the respective intermediate ones of the metallization structure levels including: a respective one of the interconnected metal lines and a respective one of the trench vias of the conductive shield, the respective one of the interconnected metal lines and the respective one of the trench vias encircling the first region of the respective intermediate one of the metallization structure levels.

9. The electronic device of claim 1, wherein the conductive shield includes a staircase shape, in which:
the second terminal of the isolation component includes opposite lateral edges spaced from one another along a first direction;
the metal lines of the respective metallization structure levels include lateral edges spaced from the respective lateral edges of the second terminal along the first direction by respective spacing distances; and
the respective spacing distances are different from one another.

10. The electronic device of claim 1, wherein the second terminal of the isolation component is in an $N^{th}$ one of the metallization structure levels, and includes an exposed side.

11. The electronic device of claim 1, further comprising a second isolation component spaced from the isolation component in the first region of the multilevel metallization structure, the second isolation component including a first terminal and a second terminal, the first and second terminals of the second isolation component being in different respective metallization structure levels of the multilevel metallization structure.

12. A packaged electronic device, comprising:
a first semiconductor die, including:
a semiconductor layer;
a multilevel metallization structure over the semiconductor layer, the multilevel metallization structure including a first region, a second region, a pre-metal level on the semiconductor layer, and an integer number N metallization structure levels over the pre-metal level, N being greater than 3;
an isolation component in the first region of the multilevel metallization structure, the isolation component including a first terminal and a second terminal, the first and second terminals being in different respective metallization structure levels of the multilevel metallization structure, the second terminal including an exposed side; and
a conductive shield between the first region and the second region in the multilevel metallization structure, the conductive shield including interconnected metal lines and trench vias in the respective metallization structure levels that at least partially encircle the first region of the multilevel metallization structure;
a second semiconductor die, including a conductive feature;
an electrical connection including a first end soldered to the exposed side of the second terminal, and a second end soldered to the conductive feature of the second semiconductor die;
a package structure that encloses the first semiconductor die, the second semiconductor die, and the electrical connection; and
conductive leads exposed along one or more sides of the package structure.

13. The packaged electronic device of claim 12, wherein the second semiconductor die includes:
a second semiconductor layer;
a second multilevel metallization structure over the second semiconductor layer, the second multilevel metallization structure including a first region, a second region, a pre-metal level on the second semiconductor layer, and an integer number M metallization structure levels over the pre-metal level, M being greater than 3;

a second isolation component in the first region of the second multilevel metallization structure, the second isolation component including a first terminal and a second terminal, the first and second terminals being in different respective metallization structure levels of the second multilevel metallization structure, the second terminal including an exposed side; and a second conductive shield between the first region and the second region in the second multilevel metallization structure, the second conductive shield including interconnected metal lines and trench vias in the respective metallization structure levels that encircle the first region of the second multilevel metallization structure.

14. The packaged electronic device of claim 12, wherein:
the isolation component is a capacitor;
the first terminal of the isolation component is a first capacitor plate; and
the second terminal of the isolation component is a second capacitor plate.

15. The packaged electronic device of claim 12, wherein:
the isolation component is a transformer;
the first terminal of the isolation component is a first transformer coil; and
the second terminal of the isolation component is a second transformer coil.

16. The packaged electronic device of claim 12, wherein the conductive shield includes a staircase shape, in which:
the second terminal of the isolation component includes opposite lateral edges spaced from one another along a first direction;
the metal lines of the respective metallization structure levels include lateral edges spaced from the respective lateral edges of the second terminal along the first direction by respective spacing distances; and
the respective spacing distances are different from one another.

17. A method, comprising:
forming a multilevel metallization structure over a semiconductor layer, the multilevel metallization structure including a first region, a second region, a pre-metal level on the semiconductor layer, an integer number N metallization structure levels over the pre-metal level, N being greater than 3; an isolation component) including a first terminal and a second terminal in the first region of the multilevel metallization structure; and a conductive shield between the first region and the second region in the multilevel metallization structure, the conductive shield including interconnected metal lines and trench vias in the respective metallization structure levels that at least partially encircle the first region of the multilevel metallization structure;
separating a first semiconductor die including the semiconductor layer and the multilevel metallization structure from a wafer;
forming an electrical connection between the second terminal of the isolation component and a conductive feature of a second semiconductor die;
enclosing the first semiconductor die, the second semiconductor die, and the electrical connection in a package structure with conductive leads exposed along one or more sides of the package structure.

18. The method of claim 17, wherein forming the multilevel metallization structure further includes:
forming a pre-metal dielectric (PMD) layer on the semiconductor layer;
forming a pre-metal trench contact on the semiconductor layer, the pre-metal trench contact encircling a portion of the first region of the PMD layer;
forming a first metallization structure level on the PMD layer, the first metallization structure level including: a first metal line on the pre-metal trench contact; a metal routing feature; a first interlevel dielectric (ILD) layer on the PMD layer, the first metal line, and the metal routing feature; a first trench via on the first metal line, the first trench via and the first metal line encircling the first region of the first metallization structure level within the second region of the first metallization structure level; and the metal routing feature extending through a gap in the first metal line; and
forming a second metallization structure level on the first metallization structure level, the second metallization structure level including: a second metal line on the first trench via; the first terminal of the isolation component, the first terminal being spaced from the second metal line; a second ILD layer on the first ILD layer, the second metal line, and the first terminal; and a second trench via on the second metal line, the second trench via and the second metal line encircling the first region of the second metallization structure level.

19. The method of claim 18, wherein forming the multilevel metallization structure further includes:
forming an $N^{th}$ metallization structure level of the N metallization structure levels above the second metallization structure level, the Nth metallization structure level including: an $N^{th}$ metal line on a trench via of an underlying metallization structure level; the second terminal of the isolation component, spaced from the $N^{th}$ metal line; and an $N^{th}$ ILD layer on the $N^{th}$ metal line, the $N^{th}$ metal line encircling the first region of the $N^{th}$ metallization structure level.

20. The method of claim 19, wherein forming the multilevel metallization structure further includes:
forming one or more intermediate ones of the metallization structure levels between the second metallization structure level and the $N^{th}$ metallization structure level, the respective intermediate ones of the metallization structure levels including: a respective one of the interconnected metal lines and a respective one of the trench vias of the conductive shield, the respective one of the interconnected metal lines and the respective one of the trench vias encircling the first region of the respective intermediate one of the metallization structure levels.

* * * * *